(12) United States Patent
Takeya

(10) Patent No.: US 12,525,584 B2
(45) Date of Patent: Jan. 13, 2026

(54) DISPLAY APPARATUS AND METHOD OF MANUFACTURING THE SAME

(71) Applicant: Seoul Semiconductor Co., Ltd., Ansan-si (KR)

(72) Inventor: Motonobu Takeya, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 93 days.

(21) Appl. No.: 18/227,965

(22) Filed: Jul. 30, 2023

(65) Prior Publication Data

US 2023/0369297 A1  Nov. 16, 2023

Related U.S. Application Data

(63) Continuation of application No. 15/895,355, filed on Feb. 13, 2018, now Pat. No. 11,756,937.

(60) Provisional application No. 62/473,791, filed on Mar. 20, 2017, provisional application No. 62/462,567, filed on Feb. 23, 2017, provisional application No. 62/458,100, filed on Feb. 13, 2017.

(51) Int. Cl.
| | |
|---|---|
| *H01L 25/075* | (2006.01) |
| *H10H 20/01* | (2025.01) |
| *H10H 20/825* | (2025.01) |
| *H10H 20/84* | (2025.01) |
| *H10H 20/851* | (2025.01) |
| *H10H 20/856* | (2025.01) |
| *H10H 20/857* | (2025.01) |

(52) U.S. Cl.
CPC ....... *H01L 25/0753* (2013.01); *H10H 20/018* (2025.01); *H10H 20/8512* (2025.01); *H10H 20/856* (2025.01); *H10H 20/857* (2025.01); *H01L 2224/16225* (2013.01); *H10H 20/0361* (2025.01); *H10H 20/0364* (2025.01); *H10H 20/825* (2025.01); *H10H 20/84* (2025.01); *H10H 20/851* (2025.01)

(58) Field of Classification Search
CPC ............. H10H 20/018; H10H 20/0361; H10H 20/0364; H10H 20/825; H10H 20/84; H10H 20/851; H10H 20/8512; H10H 20/856; H10H 20/857; H01L 2224/16225; H01L 25/0753

See application file for complete search history.

(56) References Cited

U.S. PATENT DOCUMENTS

| | | |
|---|---|---|
| 2014/0217429 A1 | 8/2014 | Lin et al. |
| 2015/0171281 A1 | 6/2015 | Nakabayashi et al. |
| 2017/0069803 A1* | 3/2017 | Lin ...................... H10H 20/853 |

(Continued)

OTHER PUBLICATIONS

Non-Final Office Action dated Feb. 8, 2019, in U.S. Appl. No. 15/895,355.

(Continued)

*Primary Examiner* — Brigitte A Paterson
(74) *Attorney, Agent, or Firm* — Oblon, McClelland, Maier & Neustadt, L.L.P.

(57) ABSTRACT

A display apparatus including a circuit board; and a plurality of pixels formed on the circuit board, wherein at least one of a blue light emitting diode chip, a red light emitting diode part, and a green light emitting diode chip is disposed in each of the pixels, and the blue light emitting diode chip, the red light emitting diode part and the green light emitting diode chip are covered by a coupling structure.

20 Claims, 20 Drawing Sheets

(56) References Cited

U.S. PATENT DOCUMENTS

| | | |
|---|---|---|
| 2018/0233494 A1 | 8/2018 | Takeya |
| 2018/0259166 A1 | 9/2018 | Min |
| 2018/0261149 A1 | 9/2018 | Lin |
| 2019/0244937 A1 | 8/2019 | Honjo et al. |

OTHER PUBLICATIONS

Non-Final Office Action dated Jul. 28, 2021, in U.S. Appl. No. 15/895,355.
Non-Final Office Action dated Jun. 13, 2022, in U.S. Appl. No. 15/895,355.
Final Office Action dated Nov. 15, 2022, in U.S. Appl. No. 15/895,355.
Notice of Allowance dated Apr. 28, 2023, in U.S. Appl. No. 15/895,355.
Non-Final Office Action dated Sep. 12, 2025, issued in related U.S. Appl. No. 17/517,296.

* cited by examiner

DISPLAY APPARATUS AND METHOD OF MANUFACTURING THE SAME

CROSS-REFERENCE TO RELATED APPLICATIONS

This application is a Continuation of U.S. patent application Ser. No. 15/895,355, filed on Feb. 13, 2018, which claims priority from and the benefit of U.S. Provisional Patent Application No. 62/473,791, filed on Mar. 20, 2017; U.S. Provisional Patent Application No. 62/462,567, filed on Feb. 23, 2017; and U.S. Provisional Patent Application No. 62/458,100, filed on Feb. 13, 2017, all of which are incorporated by reference for all purposes as if fully set forth herein.

BACKGROUND

Field

Exemplary embodiments of the present invention relate to a display apparatus and a method of manufacturing the same, and, more particularly, to a display apparatus employing a light emitting diode package having a large size as compared with a light emitting diode chip, and a method of manufacturing the same.

Discussion of the Background

A light emitting diode refers to an inorganic semiconductor device that emits light through recombination of electrons and holes. In recent years, light emitting diodes have been used in various fields including displays, automobile lamps, general lighting, and the like. Light emitting diodes have various advantages, such as long lifespan, low power consumption, and rapid response. Thus, a light emitting device using a light emitting diode can be used as a light source in various fields.

Recently, display apparatuses, such as TVs, monitors or electronic display boards, realize colors through a thin film transistor liquid crystal display (TFT-LCD) panel, and employ light emitting diodes as a light source of a backlight unit for emission of the realized colors. In addition, various studies have been conducted to develop a display apparatus capable of realizing colors through light emitting diodes instead of using a separate LCD.

In order to use light emitting diodes as a light source of a backlight unit or for direct realization of colors, one light emitting diode may be provided for each pixel. Here, in order to control each of the light emitting diodes, an active matrix (AM) drive type or a passive matrix (PM) drive type may be employed. For the AM drive type, the luminous area of each light emitting diode is 1/10,000 of the area of one pixel, and for the PM drive type, the luminous area of each light emitting diode is 1/100 of the area of one pixel.

However, light emitting diodes having an excessively large luminous area have a problem of low current density, causing deterioration in luminous efficacy. On the contrary, light emitting diodes having a small luminous area provide difficulty in mounting and replacement of a number of light emitting diodes due to a small size thereof.

The above information disclosed in this Background section is only for understanding of the background of the inventive concepts, and, therefore, it may contain information that does not constitute prior art.

SUMMARY

Exemplary embodiments of the present invention provide a display apparatus including a light emitting diode package, which employs light emitting diodes having a small luminous area as compared with the area of a pixel in order to increase yield in mounting and repair of the light emitting diodes, and a method of manufacturing the same.

Additional features of the inventive concepts will be set forth in the description which follows, and in part will be apparent from the description, or may be learned by practice of the inventive concepts.

In accordance with an exemplary embodiment of the present invention, a display apparatus includes: a circuit board; and a plurality of pixels formed on the circuit board, wherein at least one of a blue light emitting diode chip, a red light emitting diode part, and a green light emitting diode chip is disposed in each of the pixels, and the blue light emitting diode chip, the red light emitting diode part and the green light emitting diode chip are covered by a coupling structure.

The display apparatus may further include: a substrate on which the blue light emitting diode chip, the red light emitting diode part and the green light emitting diode chip are disposed; and a plurality of first substrate electrodes and a plurality of second substrate electrodes disposed on the substrate and each electrically connected to each of the blue light emitting diode chip, the red light emitting diode part and the green light emitting diode chip, the plurality of first substrate electrodes and the plurality of second substrate electrodes being electrically insulated from each other, wherein the coupling structure is disposed on the substrate.

The red light emitting diode part may be a red light emitting diode chip.

The red light emitting diode part may include: a blue light emitting diode chip or a UV light emitting diode chip disposed on the substrate; an insulating portion covering the blue or UV light emitting diode chip and containing at least one type of phosphor emitting red light through wavelength conversion of light emitted from the blue light emitting diode chip or the UV light emitting diode chip; and a color filter blocking blue light or UV light among light discharged through the insulating portion.

Each of the first substrate electrodes and each of the plural second substrate electrodes may be disposed on upper and lower surfaces of the substrate through via-holes formed in the substrate.

The first substrate electrodes and the plural second substrate electrodes are electrically connected to the circuit board.

The circuit board may have a circuit configured to allow the first substrate electrodes to be electrically connected as individual electrodes to the blue light emitting diode chip, the red light emitting diode part and the green light emitting diode chip, respectively, and to allow the second substrate electrodes to be electrically connected as common electrodes to the blue light emitting diode chip, the red light emitting diode part and the green light emitting diode chip, respectively.

The display apparatus may further include a reflective portion disposed to surround a side surface of the coupling structure and reflecting light emitted through the coupling structure.

At least one of the blue light emitting diode chip and the green light emitting diode chip may include: a light emitting structure comprising a first conductivity type semiconductor layer, a second conductivity type semiconductor layer, and an active layer interposed between the first and second conductivity type semiconductor layers; and a first electrode electrically connected to the first conductivity type semiconductor layer.

At least one of the blue light emitting diode chip and the green light emitting diode chip may further include, a second electrode electrically connected to the second conductivity type semiconductor layer, the first and second electrodes may be arranged in one direction of the light emitting structure, and the first electrode may be electrically connected to an exposed region of the first conductivity type semiconductor layer formed by partially removing the active layer and the second conductivity type semiconductor layer.

At least one of the blue light emitting diode chip and the green light emitting diode chip may further include: an encapsulation portion disposed to cover the first and second electrodes and the light emitting structure while insulating the first and second electrodes from each other; a first bump electrically connected to the first electrode; and a second bump electrically connected to the second electrode, and the first and second bumps may be electrically connected to the first and second electrodes through the encapsulation portion, respectively.

At least one of the blue light emitting diode chip and the green light emitting diode chip may have a width smaller than the substrate.

The coupling structure may include at least one of polydimethylsiloxane (PDMS), polyimide, poly(methyl methacrylate) (PMMA), a ceramic material, an epoxy resin, and a synthetic resin.

In accordance with another exemplary embodiment of the present invention, a method of manufacturing a display apparatus may include: forming a plurality of light emitting diode chips on a first manufacturing substrate; coupling at least some of the light emitting diode chips to a substrate comprising first and second substrate electrodes and provided to a second manufacturing substrate, followed by removing the first manufacturing substrate; forming an insulating portion to cover the plurality of light emitting diode chips; coupling a third manufacturing substrate to an upper surface of the insulating portion, followed by removing the second manufacturing substrate; forming a plurality of light emitting diode packages by removing the insulating portion with reference to the plurality of light emitting diode chips; and transferring some of the light emitting diode packages from the third manufacturing substrate to a printed circuit board.

Forming the plurality of light emitting diode chips may include: forming a plurality of light emitting structures on the first manufacturing substrate, each of the light emitting structures comprising a first conductivity type semiconductor layer, a second conductivity type semiconductor layer, and an active layer interposed between the first and second conductivity type semiconductor layers; forming an encapsulation portion to cover the plurality of light emitting structures and forming first and second bumps on the encapsulation portion to be electrically connected to the first and second conductivity type semiconductor layers, respectively; forming a first manufacturing insulating portion to cover the encapsulation portion and the first and second bumps; and exposing the first and second bumps through the encapsulation portion, and coupling at least some of the light emitting diode chips to the substrate comprises electrically coupling the first and second bumps to the first and second substrate electrodes.

The first and second conductivity type semiconductor layers may be exposed in one direction, first and second electrodes are formed on the first and second conductivity type semiconductor layers, respectively, and the first and second bumps may be formed to be electrically connected to the first and second electrodes through the encapsulation portion, respectively.

In coupling the third manufacturing substrate to the upper surface of the insulating portion, at least one buffer layer may be formed between the insulating portion and the third manufacturing substrate.

The insulating portion may include at least one of polydimethylsiloxane (PDMS), polyimide, poly(methyl methacrylate) (PMMA), and a ceramic material.

According to exemplary embodiments, the light emitting diode chip can have a high current density, despite a small amount of current being supplied to the light emitting diode chip through reduction in luminous area.

In addition, even with the light emitting diode chip having a small luminous area, the light emitting diode package has a large size as compared with the light emitting diode chip, thereby improving yield in manufacture and replacement of a display apparatus for repair. It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the inventive concepts, and are incorporated in and constitute a part of this specification, illustrate exemplary embodiments of the inventive concepts, and together with the description serve to describe the principles of the inventive concepts.

DETAILED DESCRIPTION OF THE ILLUSTRATED EMBODIMENTS

Figure 1:
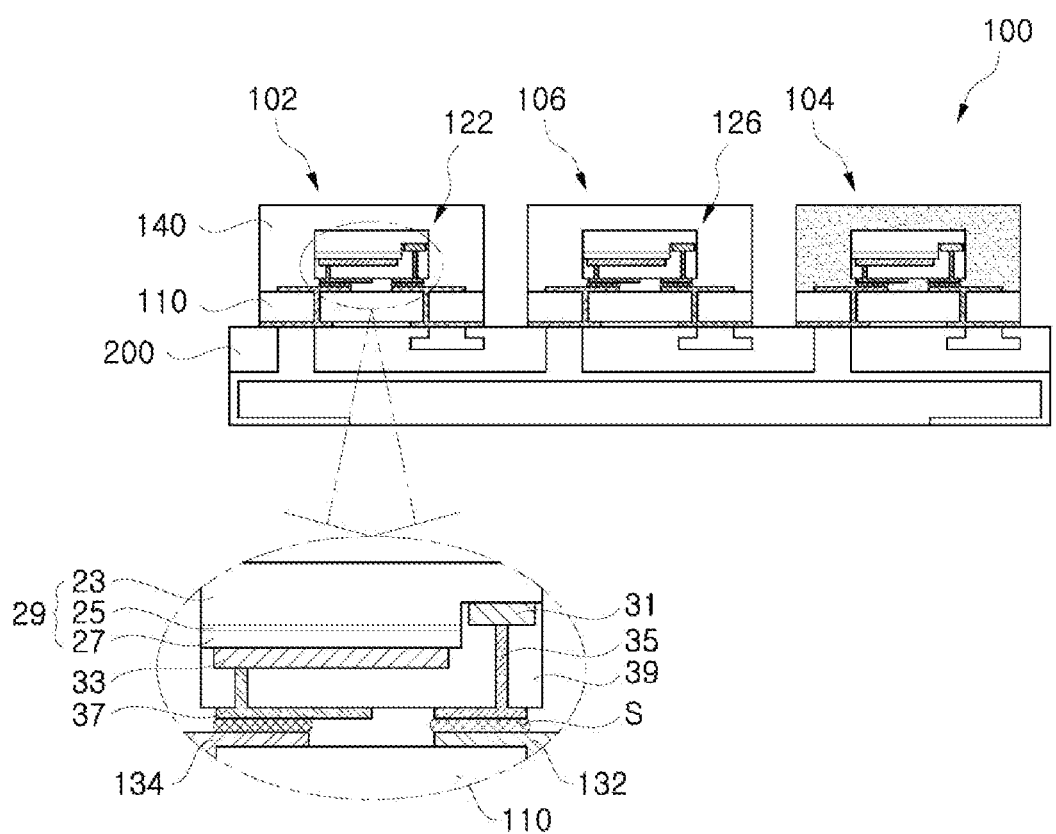
FIG. 1 is a sectional view of part of a display apparatus according to a first exemplary embodiment of the present invention.

In the following description, for the purposes of explanation, numerous specific details are set forth in order to provide a thorough understanding of various exemplary embodiments of the invention. As used herein, "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments of the present invention will be described in detail with reference to the accompanying drawings.

FIG. 1 is a sectional view of part of a display apparatus according to a first exemplary embodiment.

Referring to FIG. 1, the display apparatus 100 includes a blue light emitting diode part 102, a red light emitting diode part 104, a green light emitting diode part 106, and a printed circuit board 200. In this way, the blue light emitting diode part 102, the red light emitting diode part 104, and the green light emitting diode part 106 may be provided as a group to one pixel of the display apparatus 100.

The blue light emitting diode part 102 employs a blue light emitting diode chip 122 to discharge blue light emitted from the blue light emitting diode chip 122 to the outside, and the green light emitting diode part 106 employs a green light emitting diode chip 126 to discharge green light emitted from the green light emitting diode chip 126 to the outside. The red light emitting diode part 104 employs the blue light emitting diode chip 122 to discharge red light through wavelength conversion of blue light emitted from the blue light emitting diode chip 122. Although the red light emitting diode part 104 is configured to perform wavelength conversion in this exemplary embodiment, the red light emitting diode part 104 may employ a red light emitting diode chip to discharge red light emitted from the red light emitting diode chip, as needed.

This exemplary embodiment will be described mainly with reference to the blue light emitting diode part 102. The blue light emitting diode part 102 may include a substrate 110, the blue light emitting diode chip 122, a first substrate electrode 132, a second substrate electrode 134, and an insulating portion 140.

The substrate 110 serves to support the light emitting diode package and the light emitting diode chip. In this exemplary embodiment, the substrate 110 may be formed of an insulating material and have a predetermined thickness.

The blue light emitting diode chip 122 is disposed on the substrate 110 and may emit light upon receiving power from an external power source. As shown in FIG. 1, the blue light emitting diode chip 122 includes a light emitting structure 29, an n-type electrode 31, a p-type electrode 33, an n-type bump 35, a p-type bump 37, and an encapsulation portion 39. The light emitting structure 29 may include an n-type semiconductor layer 23, an active layer 25, and a p-type semiconductor layer 27.

Each of the n-type semiconductor layer 23, the active layer 25 and the p-type semiconductor layer 27 may include Group III-V based compound semiconductors. By way of example, each of the n-type semiconductor layer 23, the active layer 25 and the p-type semiconductor layer 27 may include nitride semiconductors such as (Al, Ga, In) N. The n-type semiconductor layer 23 may be interchangeably placed with the p-type semiconductor layer 27.

The n-type semiconductor layer 23 may be a conductive semiconductor layer containing n-type dopants (for example, Si), and the p-type semiconductor layer 27 may be a conductive semiconductor layer containing p-type dopants (for example, Mg). The active layer 25 is interposed between the n-type semiconductor layer 23 and the p-type semiconductor layer 27, and may include a multi-quantum well (MQW) structure. The composition of the active layer 25 may be determined to emit light having a desired peak wavelength.

In this exemplary embodiment, the composition of the active layer 25 may be determined such that the blue light emitting diode chip 122 can emit light having a peak wavelength in the blue wavelength band. In addition, in the structure wherein the green light emitting diode part 106 employs the green light emitting diode chip 126, the composition of the active layer 25 may be determined such that the green light emitting diode chip 126 can emit light having a peak wavelength in the green wavelength band. Further, in the structure wherein the red light emitting diode part 104 employs the red light emitting diode chip, the composition of the active layer 25 may be determined such that the red light emitting diode chip can emit light having a peak wavelength in the red wavelength band.

The light emitting structure 29 of the blue light emitting diode chip 122 or the green light emitting diode chip 126 may be an AlInGaN-based nitride semiconductor, and the light emitting structure 29 of the red light emitting diode chip may be an AlGaInP-based nitride semiconductor.

Referring to FIG. 1, in the light emitting structure 29 according to this exemplary embodiment, the active layer 25 and the n-type semiconductor layer 23 are sequentially disposed on the p-type semiconductor layer 27 in the stated order. In addition, a portion of the n-type semiconductor layer 23 may be exposed by partially removing the p-type semiconductor layer 27 and the active layer 25.

The p-type electrode 33 is disposed on a lower surface of the p-type semiconductor layer 27 to be electrically connected to the p-type semiconductor layer 27. In addition, the n-type electrode 31 is disposed on the exposed portion of the n-type semiconductor layer 23 to be electrically connected to the n-type semiconductor layer 23. That is, in this exemplary embodiment, the blue light emitting diode chip 122 may have a horizontal structure in which the n-type electrode 31 and the p-type electrode 33 are arranged in the same direction.

The encapsulation portion 39 may be disposed on the lower surface of the light emitting structure 29 to cover the n-type electrode 31, the p-type electrode 33 and the light emitting structure 29. The encapsulation portion 39 exhibits electrically insulating properties and can protect the light emitting structure 29, the n-type electrode 31 and the p-type electrode 33 from external environments. In this exemplary embodiment, the encapsulation portion 39 may be formed of a transparent material. Alternatively, the encapsulation portion 39 may be formed of an opaque material or a translucent material, as needed. Here, the encapsulation portion 39 may have the same width as the light emitting structure 29.

Each of the n-type bump 35 and the p-type bump 37 may be disposed to cover a portion of a lower surface of the encapsulation portion 39. In addition, the n-type bump 35 may be electrically connected to the n-type electrode 31 and the p-type bump 37 may be electrically connected to the p-type electrode 33 through via-holes formed in the encapsulation portion 39. The n-type bump 35 and the p-type bump 37 are spaced apart from each other on the lower surface of the encapsulation portion 39 to be electrically insulated from each other.

The first substrate electrode 132 and the second substrate electrode 134 are provided to the substrate 110. The first substrate electrode 132 extends from an upper surface of the substrate 110 to a lower surface thereof through the substrate 110. That is, a portion of the first substrate electrode 132 is disposed on the upper surface of the substrate 110 and another portion of the first substrate electrode 132 is disposed on the lower surface of the substrate 110 such that both portions of the first substrate electrode 132 are electrically connected to each other through a via-hole formed in the substrate 110. Like the first substrate electrode 132, portions of the second substrate electrode 134 are disposed on the upper and lower surfaces of the substrate 110, respectively, and are electrically connected to each other through a via-hole formed in the substrate 110. In this exemplary embodiment, the first substrate electrode 132 may be spaced apart from the second substrate electrode 134 to be electrically insulated from each other.

The portions of the first substrate electrode 132 and the second substrate electrode 134 disposed on the upper surface of the substrate 110 may be electrically connected to the n-type bump 35 and the p-type bump 37 of the light emitting diode chip, and may be electrically bonded thereto by a bonding portion S. That is, the light emitting diode chip is disposed on the substrate 110 such that the n-type bump 35 and the p-type bump 37 disposed on the lower surface of the light emitting diode chip are electrically connected to the first substrate electrode 132 and the second substrate electrode 134, respectively.

The insulating portion 140 may be disposed to cover the light emitting diode chip and the upper surface of the substrate 110. The insulating portion 140 serves to protect the light emitting structure 29 of the light emitting diode chip from external environments and to prevent an electrical short-circuit due to foreign matter. In this exemplary embodiment, the insulating portion 140 may be formed of a transparent material or a translucent material to allow light emitted from the light emitting diode chip to be discharged outside therethrough. For example, the insulating portion 140 may include at least one of polydimethylsiloxane (PDMS), polyimide, poly(methyl methacrylate) (PMMA), and a ceramic material.

The blue light emitting diode part 102, the red light emitting diode part 104, and the green light emitting diode part 106 are arranged on an upper surface of the printed circuit board 200, which supports the blue light emitting diode part 102, the red light emitting diode part 104, and the green light emitting diode part 106. The printed circuit board 200 may include a plurality of interconnection wires to supply electric power from an external power source to each of the blue light emitting diode part 102, the red light emitting diode part 104, and the green light emitting diode part 106.

In addition, as shown in FIG. 1, the printed circuit board 200 includes electrodes such that, in each of the blue light emitting diode part 102, the red light emitting diode part 104, and the green light emitting diode part 106, second substrate electrodes 134 are connected as common electrodes and first substrate electrodes 132 are connected as individual electrodes. With this structure, the blue light emitting diode part 102, the red light emitting diode part 104, and the green light emitting diode part 106 disposed on the printed circuit board 200 can be independently driven.

FIGS. 2A-2L show sectional views illustrating a method of manufacturing the display apparatus according to the first exemplary embodiment.

The method of manufacturing the display apparatus 100 according to the first exemplary embodiment will be described with reference to FIGS. 2A-2L. The following description will focus on the method of manufacturing the blue light emitting diode part 102, and description of methods of manufacturing the red light emitting diode part 104, and the green light emitting diode part 106 will be omitted since these manufacturing methods are the same as the method of manufacturing the blue light emitting diode part 102.

Figure 2A:
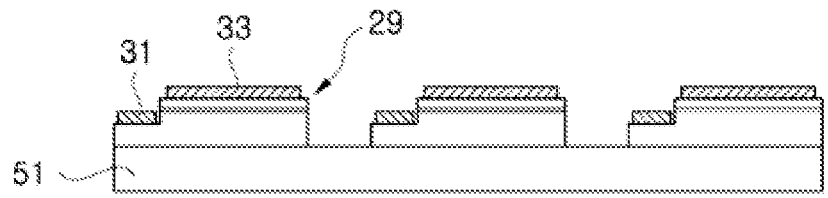
FIG. 2A, FIG. 2B, FIG. 2C, FIG. 2D, FIG. 2E, FIG. 2F, FIG. 2G, FIG. 2H, FIG. 2I, FIG. 2J, FIG. 2K, and FIG. 2L are sectional views illustrating a method of manufacturing the display apparatus according to the first exemplary embodiment.

Referring to FIG. 2A, a plurality of light emitting structures 29 is disposed on a first manufacturing substrate 51. In this exemplary embodiment, each of the light emitting structures 29 shown in the enlarged portion of FIG. 1 includes an n-type semiconductor layer 23, an active layer 25, and a p-type semiconductor layer 27, which are sequentially stacked in the stated order, and an upper surface of the n-type semiconductor layer 23 is partially exposed by partially removing the active layer 25 and the p-type semiconductor layer 27. In addition, as shown in FIG. 2A, an n-type electrode 31 is disposed in an exposed region of the upper surface of the n-type semiconductor layer 23 and a p-type electrode 33 is disposed on an upper surface of the p-type semiconductor layer 27. The light emitting structures 29 are spaced apart from one another on the first manufacturing substrate 51. Like the substrate 110, the first manufacturing substrate 51 may be formed of an insulating material and may have a predetermined thickness.

Figure 2B:
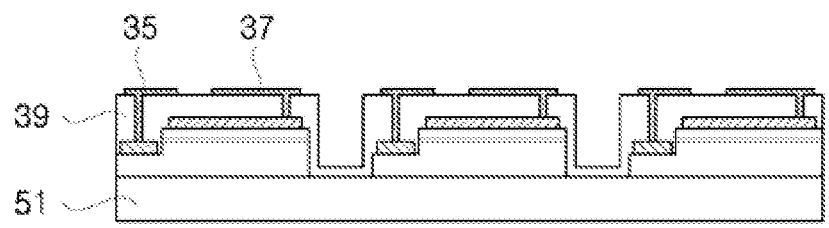

Referring to FIG. 2B, with the plurality of light emitting structures 29 disposed on the first manufacturing substrate 51, an encapsulation portion 39 is formed to cover the first manufacturing substrate 51 and the plurality of light emitting structures 29, and an n-type bump 35 and a p-type bump 37 are formed through via-holes formed in the encapsulation portion 39.

The n-type bump 35 is disposed on the n-type electrode 31 to be electrically connected to the n-type electrode 31, and the p-type bump 37 is disposed on the p-type electrode 33 to be electrically connected to the p-type electrode 33.

Figure 2C:
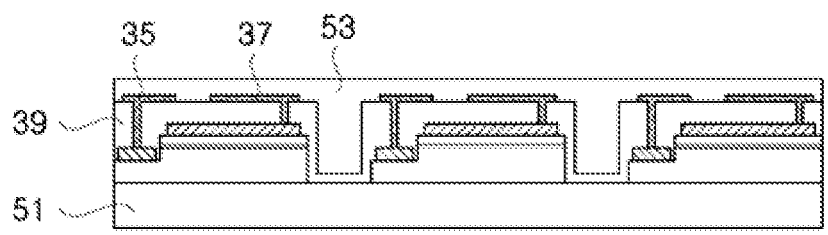

Referring to FIG. 2C, a first manufacturing insulating portion 53 is formed to cover the n-type bump 35, the p-type bump 37, and the encapsulation portion 39. The first manufacturing insulating portion 53 may include at least one of polydimethylsiloxane (PDMS), polyimide, poly(methyl methacrylate) (PMMA), and a ceramic material. Here, the first manufacturing insulating portion 53 may be formed to have a flat upper surface by filling a space between the light emitting structures 29, as shown in FIG. 2C.

Figure 2D:
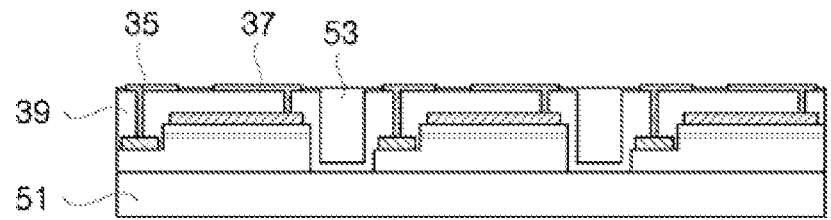

Then, referring to FIG. 2D, the n-type bump 35 and the p-type bump 37 are exposed by etching, for example, dry etching, the first manufacturing insulating portion 53. Here, the first manufacturing insulating portion 53 may be subjected to etching such that upper surfaces of the n-type bump 35 and the p-type bump 37 can be exposed.

Figure 2E:
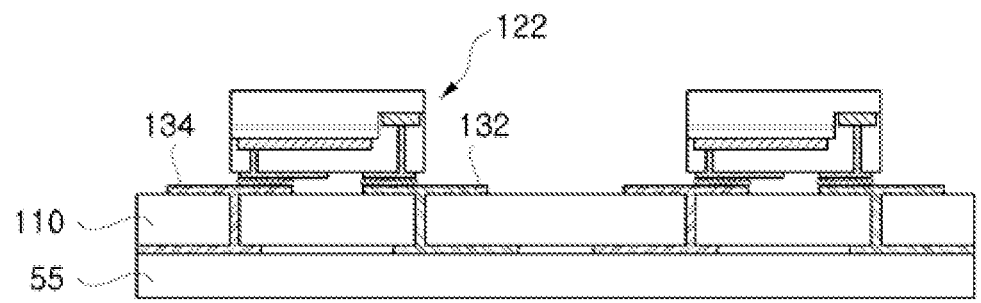

With the n-type bump 35 and the p-type bump 37 exposed, the light emitting structures 29 are isolated from one another to form blue light emitting diode chips 122, which in turn are mounted on the substrate 110 on a second manufacturing substrate 55. FIG. 2E shows a structure wherein plural blue light emitting diode chips 122 are disposed on the substrate 110. Here, the substrate 110 is disposed on the second manufacturing substrate 55 and includes first substrate electrodes 132 and second substrate electrodes 134. Each of the blue light emitting diode chips 122 is electrically connected to the first substrate electrode 132 and the second substrate electrode 134 by a bonding portion S.

Figure 2F:
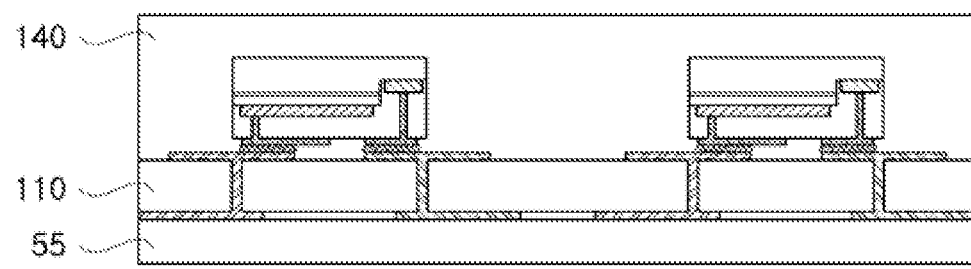

Referring to FIG. 2F, with the plural blue light emitting diode chips 122 disposed on the substrate 110, an insulating portion 140 is formed to cover the substrate 110 and the plural blue light emitting diode chips 122. The insulating portion 140 may include at least one of polydimethylsiloxane (PDMS), polyimide, poly(methyl methacrylate) (PMMA), and a ceramic material. The insulating portion 140 may be formed to have a flat upper surface by filling a space between the blue light emitting diode chip 122, as shown in FIG. 2F.

Figure 2G:
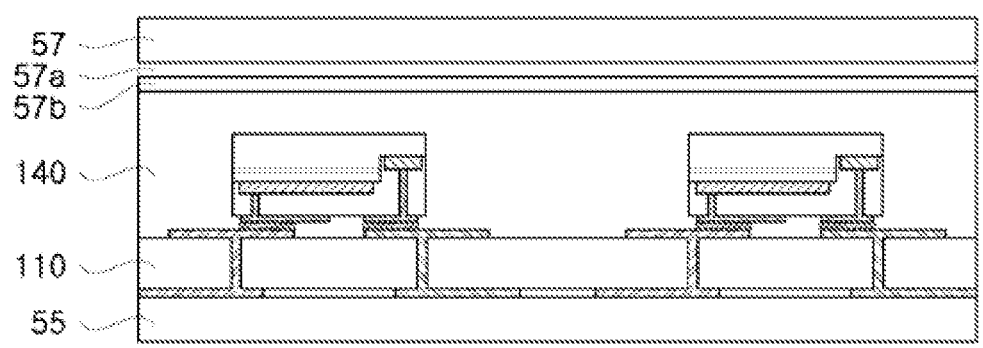

Referring to FIG. 2G, a second buffer layer 57b, a third buffer layer 57a, and a third manufacturing substrate 57 are sequentially formed on the upper surface of the insulating portion 140. The third manufacturing substrate 57 may be formed of an insulating material and may have a predetermined thickness, like the first manufacturing substrate 51 and the second manufacturing substrate 55. The third buffer layer 57a is disposed under the third manufacturing substrate 57 and the second buffer layer 57b is disposed under the third buffer layer 57a. The third buffer layer 57a may include, for example, ITO and the second buffer layer 57b may include at least one of polydimethylsiloxane (PDMS), polyimide, poly(methyl methacrylate) (PMMA), and a ceramic material.

Here, the third buffer layer 57a and the second buffer layer 57b are provided to prevent damage to the insulating portion 140 coupled to a lower surface of the third manufacturing substrate 57 upon removal of the third manufacturing substrate 57.

Figure 2H:
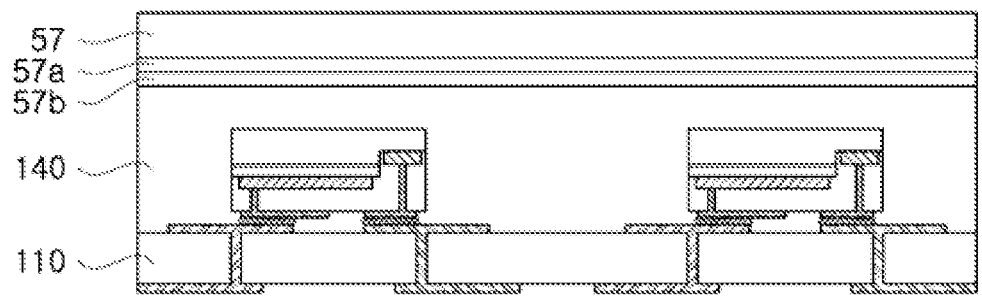

Referring to FIG. 2H, after the third manufacturing substrate 57 is coupled to an upper surface of the third buffer layer, the second manufacturing substrate 55 is removed from the lower surface of the substrate. The second manufacturing substrate 55 is removed from the lower surface of the substrate 110 so as not to prevent damage to the first substrate electrodes 132 and the second substrate electrodes 134.

Figure 2I:
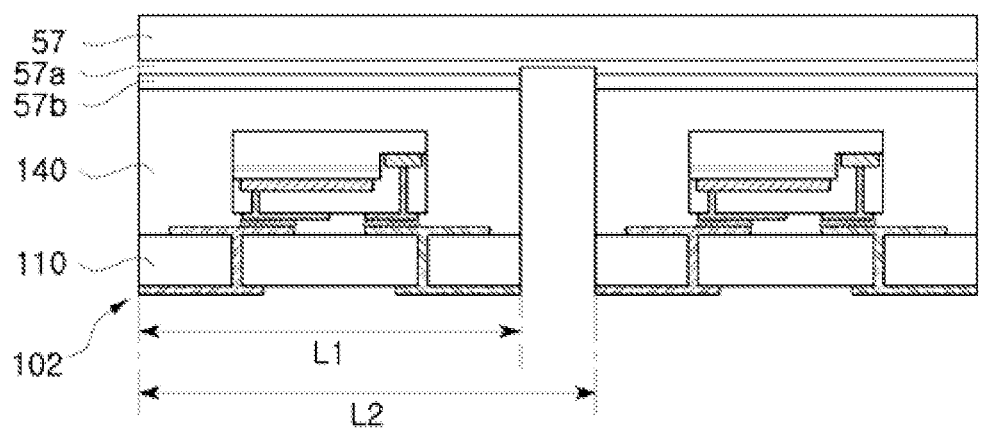

Referring to FIG. 2I, the plural blue light emitting diode chips 122 are isolated from each other by a dicing process in which a region between the blue light emitting diode chips is removed. Here, the third manufacturing substrate 57 is not subjected to dicing and the third buffer layer 57a, or the second buffer layer 57b may be partially removed.

As a result, the plurality of blue light emitting diode parts 102 may be arranged at regular intervals on a lower surface of the third manufacturing substrate 57. Here, a width L1 of each of the blue light emitting diode parts 102 may be several times less than a distance L2 between the blue light emitting diode parts 102. For example, the width L1 of each of the blue light emitting diode parts 102 may be 150 µm and the distance L2 between the blue light emitting diode parts 102 may be 375 µm or more. Although FIG. 2I shows the structure wherein the distance between the blue light emitting diode parts 102 is small, the blue light emitting diode parts 102 may be arranged at relatively wide intervals, as shown in FIG. 2J.

Figure 2J:
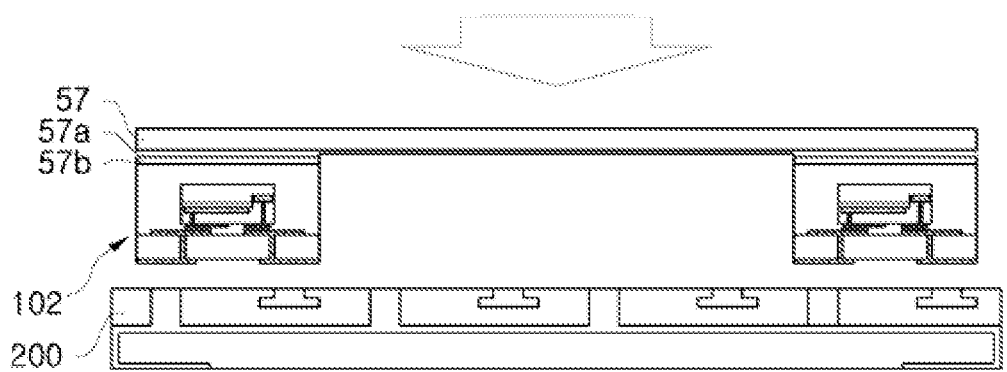

Referring to FIG. 2J, the plural blue light emitting diode parts 102 coupled to the third manufacturing substrate 57 may be transferred to an upper surface of a printed circuit board 200. To this end, force may be applied to the third manufacturing substrate 57 from above the third manufacturing substrate 57 such that each of the blue light emitting diode parts 102 can be coupled to the printed circuit board 200. Here, a bonding portion S may be applied to the printed circuit board 200.

Figure 2K:
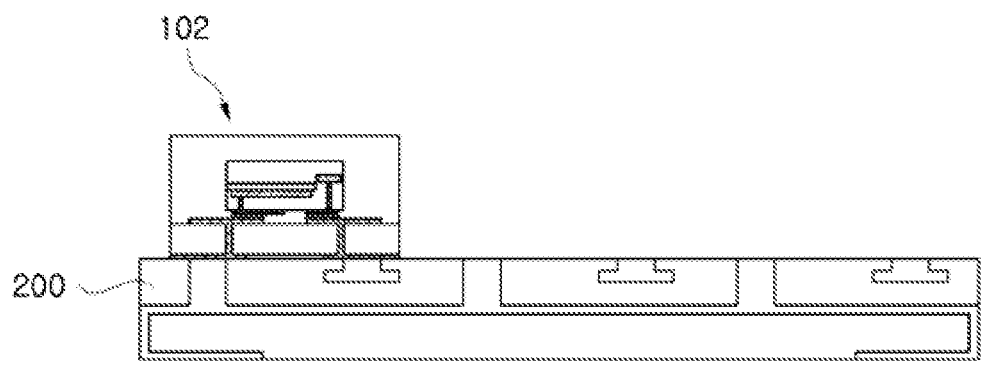

Referring to FIG. 2K, the blue light emitting diode parts 102 may be coupled to the upper surface of the printed circuit board 200 by the bonding portion S such that interconnection wires of the printed circuit board 200 can be electrically connected to the first substrate electrode 132 and the second substrate electrode 134 of each of the blue light emitting diode parts 102.

Figure 2L:
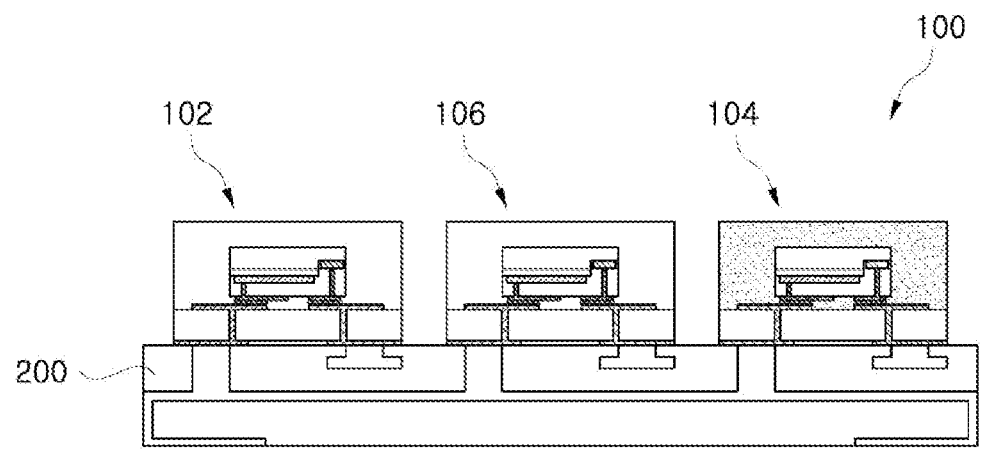

Referring to FIG. 2L, the display apparatus 100 may be manufactured by coupling red light emitting diode parts 104 and green light emitting diode parts 106 to the printed circuit board 200 through the processes described above.

Figure 3:
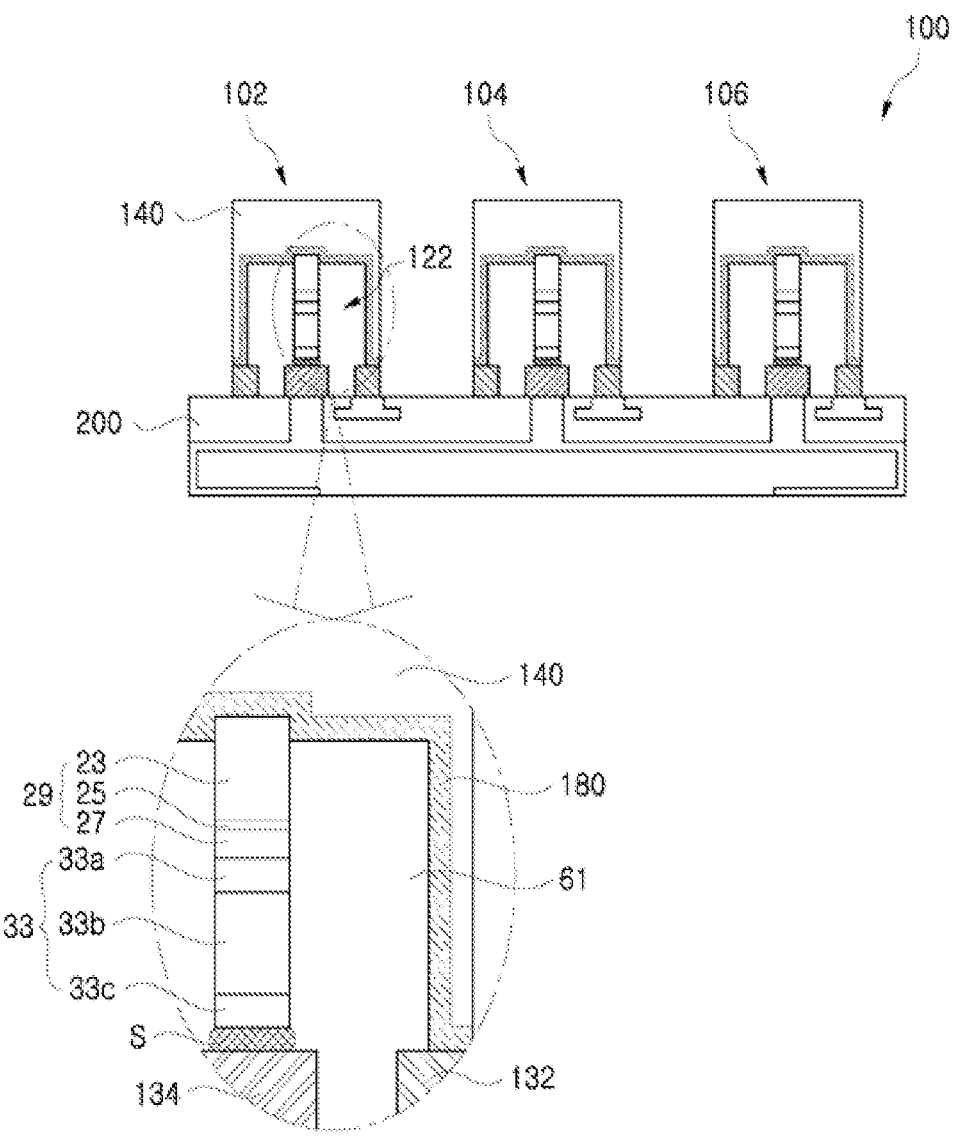
FIG. 3 is a sectional view of part of a display apparatus according to a second exemplary embodiment of the present invention.

FIG. 3 is a sectional view of part of a display apparatus according to a second exemplary embodiment.

Referring to FIG. 3, the display apparatus 100 includes a blue light emitting diode part 102, a red light emitting diode part 104, a green light emitting diode part 106, and a printed circuit board 200.

As in the first exemplary embodiment, the blue light emitting diode part 102 according to this exemplary embodiment employs a blue light emitting diode chip 122 to discharge blue light emitted from the blue light emitting diode chip 122 to the outside, and the green light emitting diode part 106 employs a green light emitting diode chip 126 to discharge green light emitted from the green light emitting diode chip 126 to the outside. The red light emitting diode part 104 employs the blue light emitting diode chip 122 to discharge red light through wavelength conversion of blue light emitted from the blue light emitting diode chip 122.

Although the red light emitting diode part 104 is configured to perform wavelength conversion in this exemplary embodiment, the red light emitting diode part 104 may employ a red light emitting diode chip to discharge red light emitted from the red light emitting diode chip, as needed.

In this exemplary embodiment, the blue light emitting diode part 102 includes the blue light emitting diode chip 122, a first substrate electrode 132, a second substrate electrode 134, an insulating portion 140, and a connection electrode 180.

As shown in FIG. 3, the blue light emitting diode chip 122 has a vertical structure and may include a light emitting structure 29 and a p-type electrode 33. Here, the light emitting structure 29 may include an n-type semiconductor layer 23, an active layer 25, and a p-type semiconductor layer 27.

The light emitting structure 29 includes a p-type semiconductor layer 27 disposed at a lower side thereof, an n-type semiconductor layer 23 disposed at an upper surface thereof, and an active layer 25 interposed between the p-type semiconductor layer 27 and the n-type semiconductor layer 23. Although an n-type electrode 31 may be disposed on an upper surface of the n-type semiconductor layer 23, description of the n-type electrode 31 is omitted in this exemplary embodiment.

The p-type electrode 33 is disposed on a lower surface of the p-type semiconductor layer 27 and includes first to third electrode portions 33a, 33b, 33c. The first electrode portion 33a electrically contacts the p-type electrode 33, and the second electrode portion 33b and the third electrode portion 33c are sequentially disposed on a lower surface of the first electrode portion 33a. In this exemplary embodiment, the first electrode portion 33a may include gold (Au), the second electrode portion 33b may include aluminum (Al), and the third electrode portion 33c may include silver (Ag).

Although the p-type electrode 33 according to this exemplary embodiment has a multilayer structure including the first to third electrode portions 33a, 33b, 33c, the p-type electrode 33 may have a monolayer structure, as needed, and the p-type electrode 33 may have a thinner thickness than that shown in FIG. 3.

In this exemplary embodiment, the light emitting structure 29 is disposed on the first substrate electrode 132 and the p-type electrode 33 of the light emitting structure 29 is electrically connected to the first substrate electrode 132. Here, the p-type electrode 33 may be coupled to the first substrate electrode 132 by a bonding portion S.

In addition, the connection electrode 180 is disposed to cover the upper surface of the n-type semiconductor layer 23. The connection electrode 180 electrically connects the n-type semiconductor layer 23 to the second substrate electrode 134 and may include a transparent material, for example, ITO or ZnO, to allow light emitted from the blue light emitting diode chip 122 to pass therethrough.

The first substrate electrode 132 and the second substrate electrode 134 are disposed under the blue light emitting diode chip 122 and are spaced apart from each other so as to be electrically insulated from each other. As described above, the first substrate electrode 132 is electrically connected to the p-type electrode 33 and the second substrate electrode 134 is electrically connected to the n-type semiconductor layer 23 through the connection electrode 180.

The insulating portion 140 is disposed to cover the blue light emitting diode chip 122. The insulating portion 140 serves to protect the blue light emitting diode chip 122 and the connection electrode 180 from the external environment and to prevent an electrical short-circuit due to foreign matter. In this exemplary embodiment, the insulating portion 140 may be formed of a transparent material or a translucent material to allow light emitted from the blue light emitting diode chip 122 to be discharged outside therethrough. For example, the insulating portion 140 may include at least one of polydimethylsiloxane (PDMS), polyimide, poly(methyl methacrylate) (PMMA), and a ceramic material.

Further, in this exemplary embodiment, a second manufacturing insulating portion 61 is disposed between the blue light emitting diode chip 122 and the connection electrode 180. The second manufacturing insulating portion 61 is formed prior to the insulating portion 140 by a different process from the process of forming the insulating portion 140 in manufacture of the display apparatus 100 according to this exemplary embodiment. The second manufacturing insulating portion 61 is formed of the same material as the insulating portion 140 and may contact the insulating portion 140 excluding a region in which the connection electrode 180 is disposed. That is, in the blue light emitting diode part 102 according to this exemplary embodiment, the second manufacturing insulating portion 61 may have the same structure as the insulating portion 140.

The blue light emitting diode part 102, the red light emitting diode part 104 and the green light emitting diode part 106 are arranged on an upper surface of the printed circuit board 200, which supports the blue light emitting diode part 102, the red light emitting diode part 104 and the green light emitting diode part 106. In addition, the printed circuit board 200 may include a plurality of interconnection wires to supply electric power from an external power source to the blue light emitting diode part 102, the red light emitting diode part 104 and the green light emitting diode part 106.

Figure 4A:
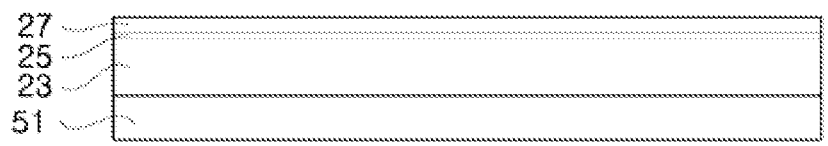
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O, FIG. 4P, FIG. 4Q, FIG. 4R, and FIG. 4S are sectional views illustrating a method of manufacturing the display apparatus according to the second exemplary embodiment.
Figure 4B:
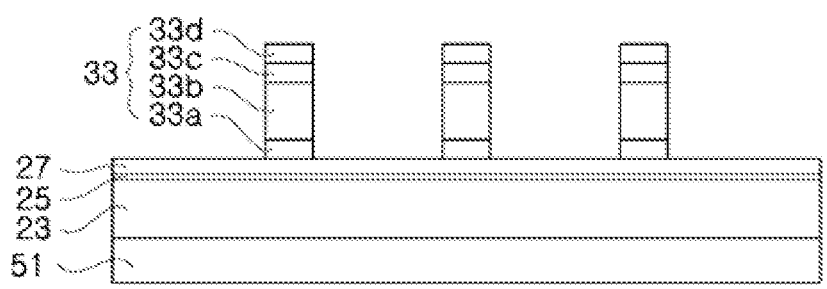
Figure 4C:
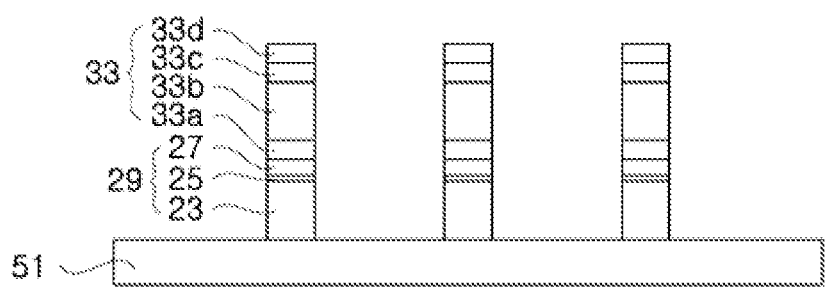
Figure 4D:
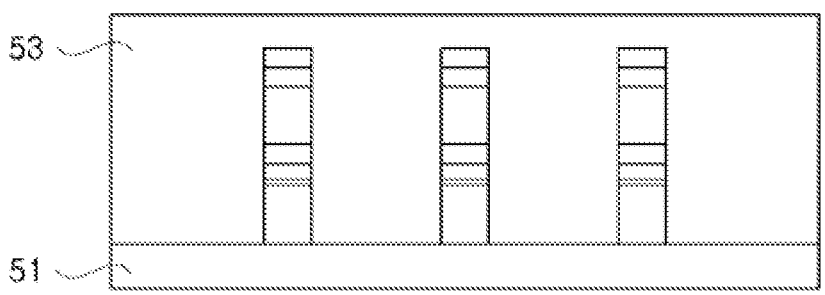
Figure 4E:
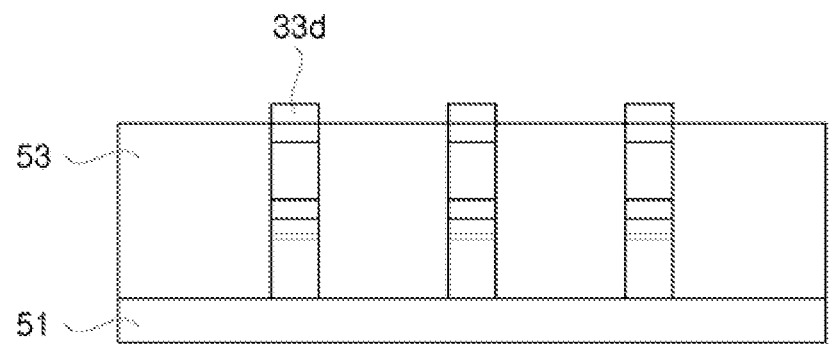
Figure 4F:
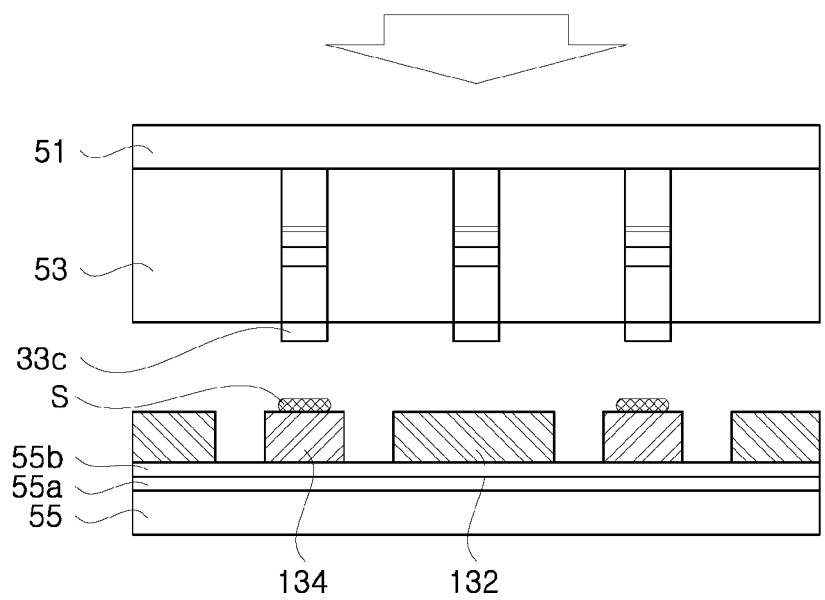
Figure 4G:
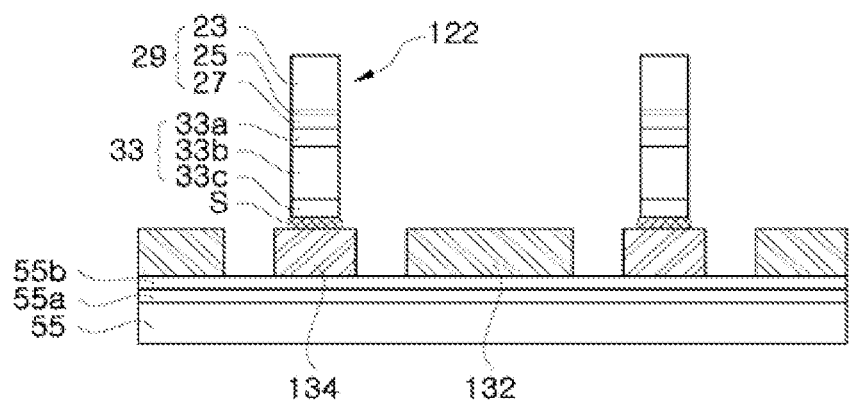
Figure 4H:
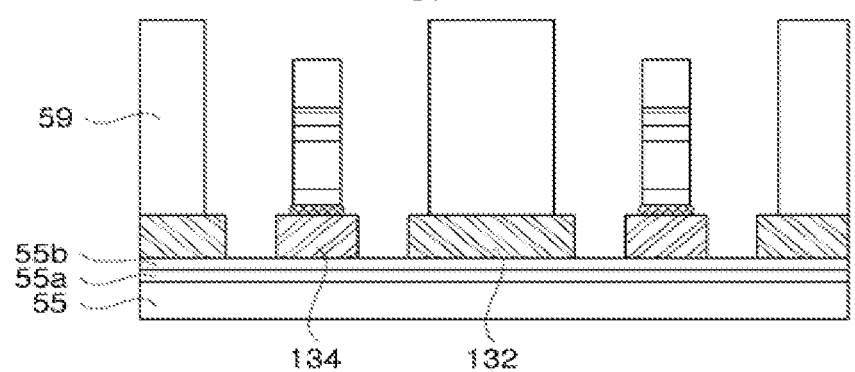
Figure 4I:
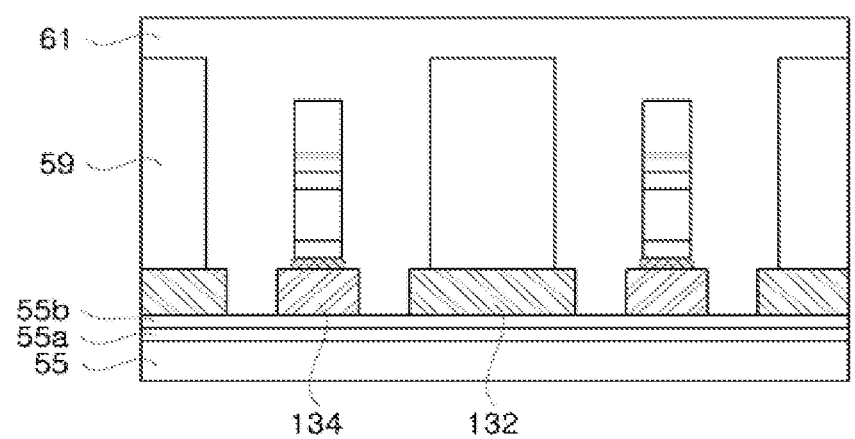
Figure 4J:
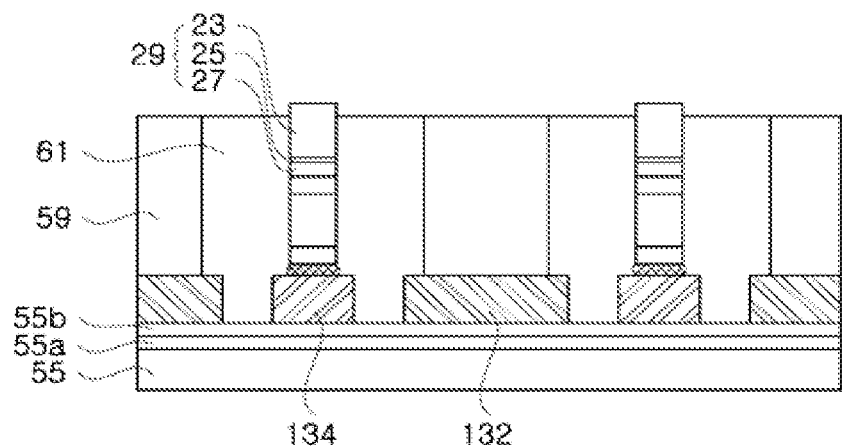
Figure 4K:
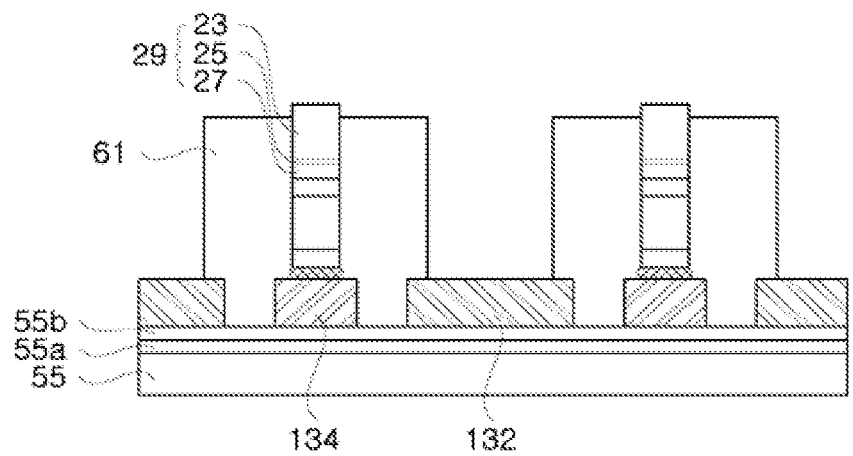
Figure 4L:
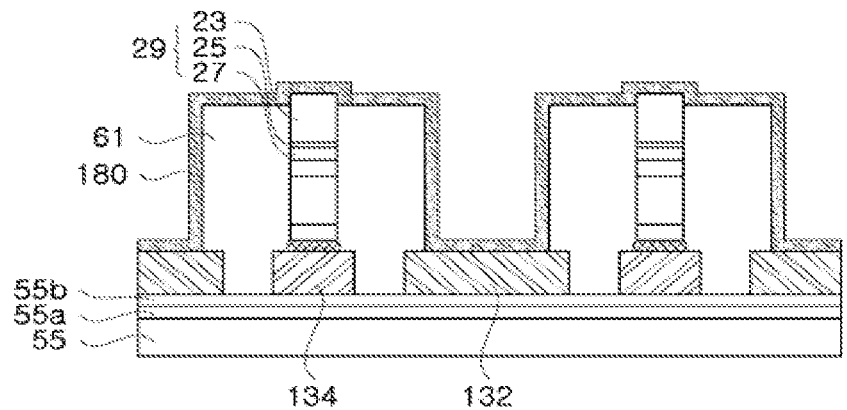
Figure 4M:
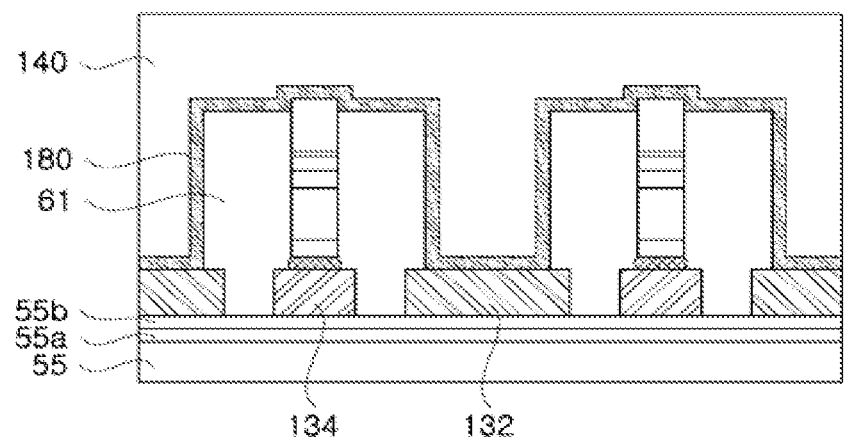
Figure 4N:
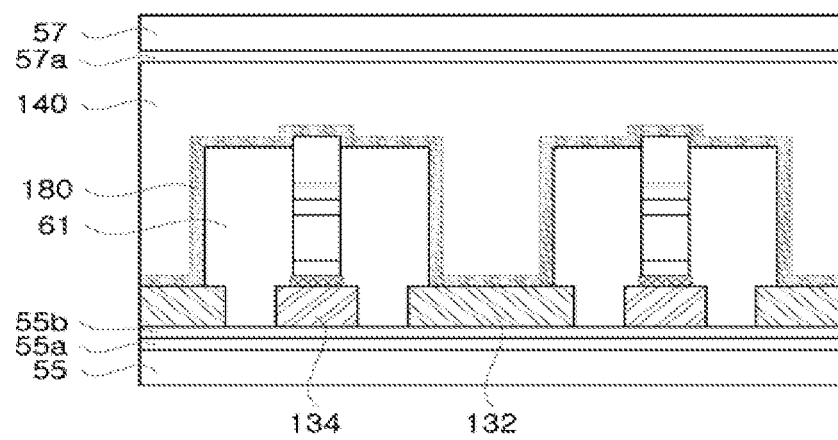
Figure 4O:
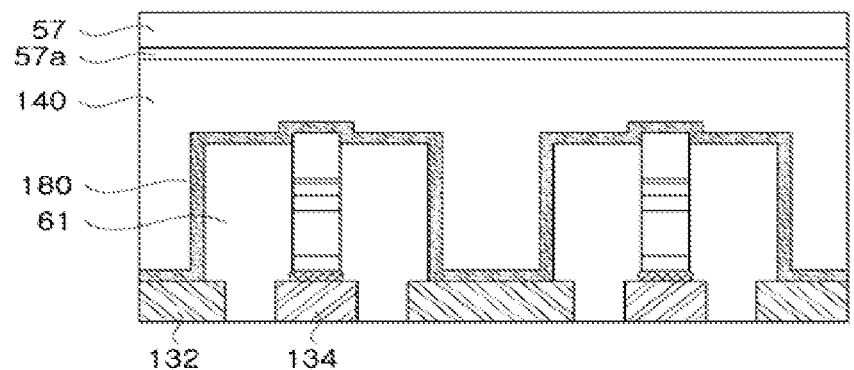
Figure 4P:
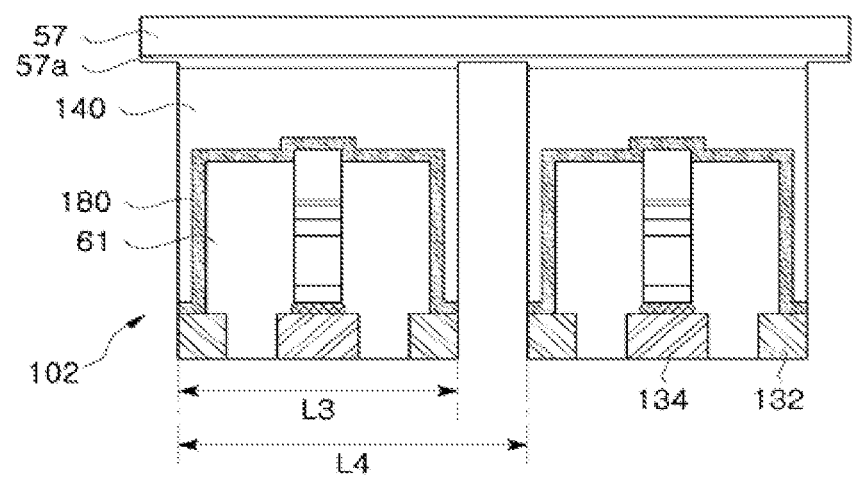
Figure 4Q:
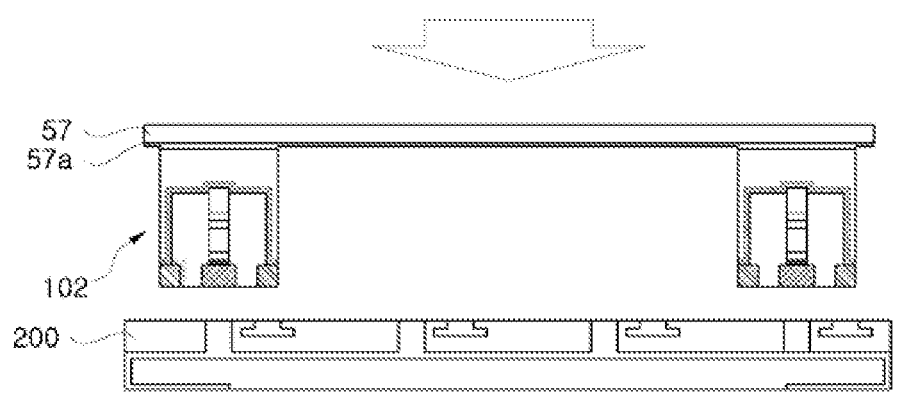
Figure 4R:
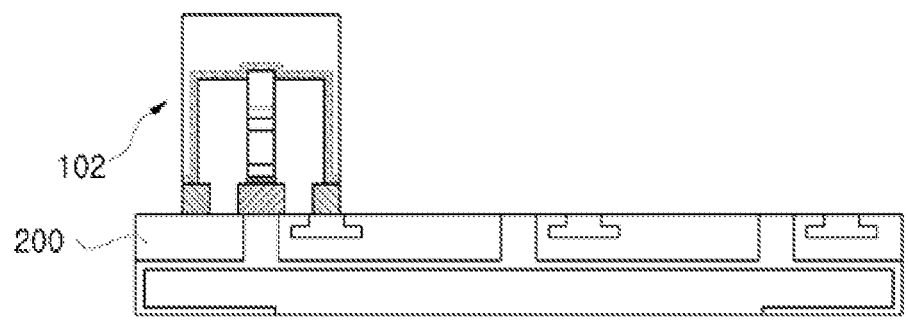
Figure 4S:
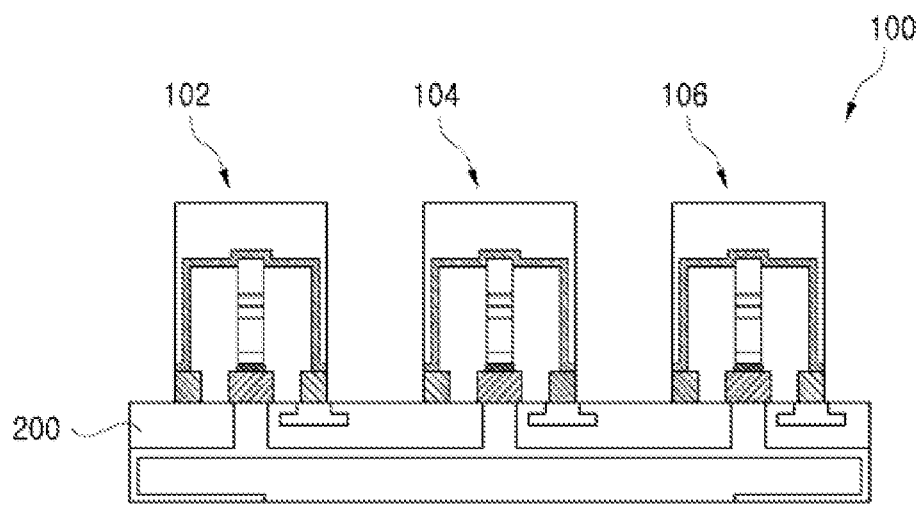

FIG. 4A-FIG. 4S show sectional views illustrating a method of manufacturing the display apparatus according to the second exemplary embodiment of the present invention.

The method of manufacturing the display apparatus 100 according to the second exemplary embodiment will be described with reference to FIG. 4A-FIG. 4S. The following description will focus on the method of manufacturing the blue light emitting diode part 102, and description of methods of manufacturing the red light emitting diode part 104 and the green light emitting diode part 106 will be omitted since these manufacturing methods are the same as the method of manufacturing the blue light emitting diode part 102.

Referring to FIG. 4A, an n-type semiconductor layer 23, an active layer 25 and a p-type semiconductor layer 27 are sequentially stacked on a first manufacturing substrate 51.

Referring to FIG. 4B, a plurality of p-type electrodes 33 are formed on the stacked structure of the n-type semiconductor layer 23, the active layer 25, and the p-type semiconductor layer 27. Here, each of the p-type electrodes 33 includes first to fourth electrode portions 33a, 33b, 33c, 33d, which are sequentially stacked on an upper surface of the p-type semiconductor layer 27. The p-type electrodes 33 are regularly arranged at constant intervals in rows and columns.

The first electrode portion 33a may include gold (Au), the second electrode portion 33b may include aluminum (Al), the third electrode portion 33c may include silver (Ag), and the fourth electrode portion 33d may include chromium (Cr).

Referring to FIG. 4C, a plurality of light emitting structures 29 each having the same width as the p-type electrode 33 is formed by etching the n-type semiconductor layer 23, the active layer 25 and the p-type semiconductor layer 27 with reference to each of the p-type electrodes 33. That is, the plurality of light emitting structures 29 are disposed under the p-type electrodes 33, respectively.

After the plurality of light emitting structures 29 are formed, a first manufacturing insulating portion 53 is formed on the first manufacturing substrate 51 to cover the plurality of light emitting structures 29 and the p-type electrode 33, as shown in FIG. 4D. The first manufacturing insulating portion 53 is formed to have a flat upper surface by filling a space between the light emitting structures 29. The first manufacturing insulating portion 53 may be formed of a transparent material or a translucent material. For example, the first manufacturing insulating portion 53 may include at least one of polydimethylsiloxane (PDMS), polyimide, poly (methyl methacrylate) (PMMA), and a ceramic material.

Referring to FIG. 4E, the fourth electrode portions 33d are exposed on the first manufacturing insulating portion 53 by etching an upper portion of the first manufacturing insulating portion 53. Etching of the first manufacturing insulating portion 53 may be performed by dry etching until the third electrode portions 33c are exposed. Thereafter, the fourth electrode portions 33d are removed by separate etching.

Next, referring to FIG. 4F, the first manufacturing substrate 51 is turned upside down to couple the third electrode portions 33c to first substrate electrodes 132. Here, the first substrate electrodes 132 and second substrate electrodes 134 are disposed on the second manufacturing substrate 55, and a first substrate buffer layer 55a and a second substrate buffer layer 55b may be formed on the second manufacturing substrate 55. The first substrate buffer layer 55a may be formed of ITO and the second substrate buffer layer 55b may be formed of $SiO_2$.

That is, the first manufacturing substrate 51 and the second manufacturing substrate 55 are disposed on the second substrate buffer layer 55b. Here, the first manufacturing substrate 51 and the second manufacturing substrate 55 may be spaced apart from each other.

Then, a bonding portion S is formed on the first substrate electrodes 132. Thus, when the first manufacturing substrate 51 is compressed downward, the p-type electrodes 33 can be coupled to the first manufacturing substrate 51 on which the bonding portion S is formed, while contacting the second manufacturing substrate 55 on which the bonding portion S is not formed.

As a result, blue light emitting diode chips 122 are formed on the first substrate electrodes 132, as shown in FIG. 4G. That is, the blue light emitting diode chips 122 may be separated from the first manufacturing insulating portion 53 and coupled to the upper surface of the first manufacturing substrate 51.

Referring to FIG. 4H, a shielding portion 59 is formed on the second substrate electrodes 134. The shielding portion 59 may be formed to have a greater height than the blue light emitting diode chips 122. The shielding portion 59 may be formed of a transparent or opaque material and may exhibit electrically insulating or conductive properties.

Referring to FIG. 4I, a second manufacturing insulating portion 61 is formed on the second manufacturing substrate 55 to cover the blue light emitting diode chips 122 and the shielding portion 59. The second manufacturing insulating portion 61 may be formed of the same material as the first manufacturing insulating portion 53. The second manufacturing insulating portion 61 may be formed to fill spaces between the first substrate electrodes 132 and the second substrate electrodes 134. With this structure, the second manufacturing insulating portion 61 is interposed between the first substrate electrodes 132 and the second substrate electrodes 134 such that the first substrate electrodes 132 and the second substrate electrodes 134 can be electrically insulated from each other while being coupled to each other instead of being separated from each other.

Referring to FIG. 4J, the n-type semiconductor layer 23 of the blue light emitting diode chip 122 is partially exposed by etching the second manufacturing insulating portion 61 and the shielding portion 59. Here, the second manufacturing insulating portion 61 and the shielding portion 59 may be etched such that upper surfaces of the second manufacturing insulating portion 61 and the shielding portion 59 are flush with each other, and the n-type semiconductor layer 23 may protrude from the upper surface of the second manufacturing insulating portion 61.

Next, the shielding portion 59 is removed by lift-off, as shown in FIG. 4K, and a connection electrode 180 is formed as shown in FIG. 4L. The connection electrode 180 may be formed of a transparent material, for example, ITO or ZnO, and cover the n-type semiconductor layer 23 exposed on the upper surface of the second manufacturing insulating portion 61 to be electrically connected thereto. In addition, the connection electrode 180 extends along the upper and side surfaces of the second manufacturing insulating portion 61 to an upper surface of the second substrate electrode 134. With this structure, the connection electrode 180 can be electrically connected to the second substrate electrode 134. In addition, the connection electrode 180 extends to cover the n-type semiconductor layer 23 of adjacent blue light emitting diode chips 122.

After the connection electrode 180 is formed as described above, an insulating portion 140 is formed to cover the connection electrode 180 and the second manufacturing insulating portion 61, as shown in FIG. 4M. The insulating portion 140 may be formed of the same transparent or translucent material as the second manufacturing insulating portion 61. The insulating portion 140 may be formed to have a flat upper surface.

Referring to FIG. 4N, a third manufacturing substrate 57 is coupled to an upper portion of the insulating portion 140. Here, a third buffer layer 57a may be formed between the third manufacturing substrate 57 and the insulating portion 140. The third buffer layer 57a may be formed of ITO.

Referring to FIG. 4O, after the third manufacturing substrate 57 is coupled to the insulating portion 140, the second manufacturing substrate 55 is removed from the lower surface of the substrate. The first substrate buffer layer 55a and the second substrate buffer layer 55b can prevent damage to the first substrate electrode 132, the second substrate electrode 134 and the second manufacturing insulating portion 61 upon removal of the second manufacturing substrate 55.

Referring to FIG. 4P, the plural blue light emitting diode chips 122 are isolated from each other. Here, isolation of the blue light emitting diode chips 122 is performed with reference to a central region of the second substrate electrode 134. As a result, the plural blue light emitting diode parts 102 are arranged on a lower surface of the third manufacturing substrate 57.

In this exemplary embodiment, a width L3 of each of the blue light emitting diode parts 102 may be several times less than a distance L4 between the blue light emitting diode parts 102. For example, the width L3 of each of the blue light emitting diode parts 102 may be 20 μm and the distance L4 between the blue light emitting diode parts 102 may be 100 μm or more. Although FIG. 4P shows the structure wherein the distance between the blue light emitting diode parts 102 is small, the blue light emitting diode parts 102 may be arranged at wide intervals, as shown in FIG. 4Q.

Referring to FIG. 4Q, the plural blue light emitting diode parts 102 coupled to the third manufacturing substrate 57 may be transferred to an upper surface of a printed circuit board 200. To this end, force may be applied to the third manufacturing substrate 57 from above the third manufacturing substrate 57 such that each of the blue light emitting diode parts 102 can be coupled to the printed circuit board 200. Here, a bonding portion S may be applied to the printed circuit board 200.

Referring to FIG. 4R, the blue light emitting diode parts 102 may be coupled to the upper surface of the printed circuit board 200 by the bonding portion S such that interconnection wires of the printed circuit board 200 can be electrically connected to the first substrate electrode 132 and the second substrate electrode 134 of each of the blue light emitting diode parts 102.

Referring to FIG. 4S, the display apparatus 100 may be manufactured by coupling red light emitting diode parts 104 and green light emitting diode parts 106 to the printed circuit board 200 through the processes described above.

Figure 5:
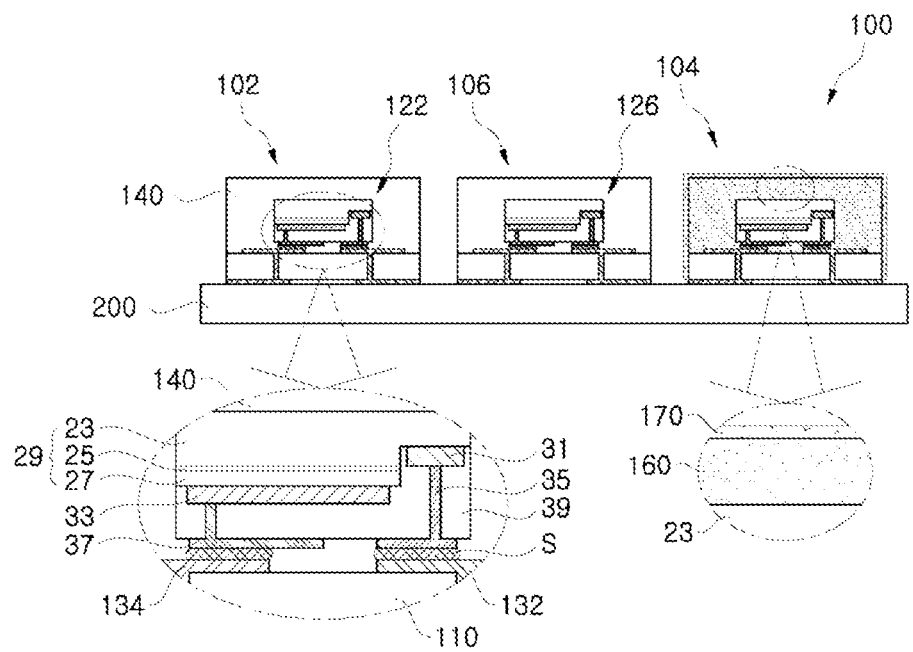
FIG. 5 is a sectional view of part of a display apparatus according to a third exemplary embodiment of the present invention.

FIG. 5 is a sectional view of part of a display apparatus according to a third exemplary embodiment.

Referring to FIG. 5, the display apparatus 100 includes a blue light emitting diode part 102, a red light emitting diode part 104, a green light emitting diode part 106, and a circuit board 200.

The blue light emitting diode part 102 includes a substrate 110, a blue light emitting diode chip 122, a first substrate electrode 132, a second substrate electrode 134, and an insulating portion 140.

The substrate 110 supports the blue light emitting diode package 100 and the light emitting diode chip 120. In this exemplary embodiment, the substrate 110 may include an insulating material and have a predetermined thickness.

The blue light emitting diode chip 122 is disposed on the substrate 110 and may emit light upon receiving power from an external power source. As shown in FIG. 5, the blue light emitting diode chip 122 includes a light emitting structure 29, an n-type electrode 31, a p-type electrode 33, an n-type bump 35, a p-type bump 37, and an encapsulation portion 39. The light emitting structure 29 may include an n-type semiconductor layer 23, an active layer 25, and a p-type semiconductor layer 27.

Each of the n-type semiconductor layer 23, the active layer 25 and the p-type semiconductor layer 27 may include Group III-V based compound semiconductors. By way of example, each of the n-type semiconductor layer 23, the active layer 25 and the p-type semiconductor layer 27 may include nitride semiconductors such as (Al, Ga, In) N. The n-type semiconductor layer 23 may be interchangeably placed with the p-type semiconductor layer 27.

The n-type semiconductor layer 23 may be a conductive semiconductor layer containing n-type dopants (for example, Si), and the p-type semiconductor layer 27 may be a conductive semiconductor layer containing p-type dopants (for example, Mg). The active layer 25 is interposed between the n-type semiconductor layer 23 and the p-type semiconductor layer 27, and may include a multi-quantum well (MQW) structure. The composition of the active layer 25 may be determined to emit light having a desired peak wavelength. In this exemplary embodiment, the composition of the active layer 25 may be determined such that the blue light emitting diode chip 122 can emit light having a peak wavelength in the blue wavelength band. By way of example, the light emitting structure 29 may be an AlInGaN-based nitride semiconductor.

Referring again to FIG. 5, in the light emitting structure 29 according to this exemplary embodiment, the active layer 25 and the n-type semiconductor layer 23 are sequentially disposed on the p-type semiconductor layer 27 in the stated order. In addition, a portion of the n-type semiconductor layer 23 may be exposed by partially removing the p-type semiconductor layer 27 and the active layer 25.

The n-type electrode 31 is disposed on a lower surface of the n-type semiconductor layer 23 to be electrically connected to the n-type semiconductor layer 23 and the p-type electrode 33 is disposed on a lower surface of the p-type semiconductor layer 27 to be electrically connected to the p-type semiconductor layer 27. That is, in this exemplary embodiment, the blue light emitting diode chip 122 may have a horizontal structure in which the n-type electrode 31 and the p-type electrode 33 are arranged in the same direction.

The encapsulation portion 39 may be disposed on the lower surface of the light emitting structure 29 to cover the n-type electrode 31, the p-type electrode 33 and the light emitting structure 29. The encapsulation portion 39 exhibits electrically insulating properties and can protect the light emitting structure 29, the n-type electrode 31 and the p-type electrode 33 from external environments. In this exemplary embodiment, the encapsulation portion 39 may be formed of a transparent material. Alternatively, the encapsulation portion 39 may be formed of an opaque material or a translucent material, as needed. Here, the encapsulation portion 39 may have the same width as the light emitting structure 29.

The n-type bump 35 and the p-type bump 37 may be disposed to cover a portion of a lower surface of the encapsulation portion 39 and may be electrically connected to the n-type electrode 31 and the p-type electrode 33 through via-holes formed in the encapsulation portion 39, respectively. The n-type bump 35 and the p-type bump 37 are spaced apart from each other on the lower surface of the encapsulation portion 39 to be electrically insulated from each other.

The first substrate electrode 132 and the second substrate electrode 134 are provided to the substrate 110. The first substrate electrode 132 extends from an upper surface of the substrate 110 to a lower surface thereof through the substrate 110. That is, a portion of the first substrate electrode 132 is disposed on the upper surface of the substrate 110 and another portion of the first substrate electrode 132 is disposed on the lower surface of the substrate 110 such that both portions of the first substrate electrode 132 are electrically connected to each other through a via-hole formed in the substrate 110. Like the first substrate electrode 132, portions of the second substrate electrode 134 are disposed on the upper and lower surfaces of the substrate 110, respectively, and are electrically connected to each other through a via-hole formed in the substrate 110. In this exemplary embodiment, the first substrate electrode 132 may be spaced apart from the second substrate electrode 134 to be electrically insulated from each other.

The portions of the first substrate electrode 132 and the second substrate electrode 134 disposed on the upper surface of the substrate 110 may be electrically connected to the n-type bump 35 and the p-type bump 37 of the light emitting diode chip 120, and may be bonded thereto by a bonding portion S. That is, the light emitting diode chip 120 is disposed on the substrate 110 such that the n-type bump 35 and the p-type bump 37 disposed on the lower surface of the light emitting diode chip 120 are electrically connected to the first substrate electrode 132 and the second substrate electrode 134, respectively.

The insulating portion 140 is disposed to cover the light emitting diode chip and the upper surface of the substrate 110. The insulating portion 140 serves to protect the light emitting structure 29 of the light emitting diode chip from external environments and to prevent electric short due to foreign matter. In this exemplary embodiment, the insulating portion 140 may be formed of a transparent material or a translucent material to allow light emitted from the light emitting diode chip to be discharged outside therethrough. For example, the insulating portion 140 may include at least one of polydimethylsiloxane (PDMS), polyimide, poly(methyl methacrylate) (PMMA), and a ceramic material.

The red light emitting diode part 104 includes a substrate 110, a blue light emitting diode chip 122, a first substrate electrode 132, a second substrate electrode 134, a phosphor portion 160, and a color filter 170.

In this exemplary embodiment, the substrate 110, the blue light emitting diode chip 122, the first substrate electrode 132 and the second substrate electrode 134 of the red light emitting diode part 104 are the same as those of the blue light emitting diode part 102 and detailed descriptions thereof will be omitted.

As in the insulating portion 140 of the blue light emitting diode part 102, the phosphor portion 160 may be disposed to cover the blue light emitting diode chip 122 and an upper surface of the substrate 110. The phosphor portion 160 may contain at least one type of phosphor. Specifically, the phosphor portion 160 may contain a phosphor capable of emitting red light through wavelength conversion of blue light emitted from the blue light emitting diode chip 122.

Although the red light emitting diode part 104 includes the blue light emitting diode chip 122 in this exemplary embodiment, the red light emitting diode part 104 may include a UV light emitting diode chip, as needed. In the structure wherein the red light emitting diode part 104 includes the UV light emitting diode chip, the phosphor portion 160 may contain a phosphor capable of emitting red light through wavelength conversion of UV light emitted from the UV light emitting diode chip 122.

According to this exemplary embodiment, the phosphor portion 160 may include at least one type of phosphor together with at least one of polydimethylsiloxane (PDMS), polyimide, poly(methyl methacrylate) (PMMA), and a ceramic material, which are transparent or translucent materials.

The color filter 170 may be disposed to cover upper and side surfaces of the phosphor portion 160 and the side surface of the substrate 110. The color filter 170 serves to block light in a predetermined range of wavelengths among light emitted through the phosphor portion 160. In this exemplary embodiment, the color filter 170 blocks blue light emitted from the blue light emitting diode chip 122 while allowing red light emitted from the phosphor portion 160 through wavelength conversion to pass therethrough. Accordingly, the color filter 170 can minimize discharge of blue light from the light emitting diode package. That is, the color filter 170 is provided to the light emitting diode package in order to maximize the ratio of light subjected to wavelength conversion by the phosphor portion 160 to light emitted through the color filter 170.

The color filter 170 may have as small a thickness as possible on the upper and side surfaces of the phosphor portion 160 while blocking as much blue light emitted from the blue light emitting diode chip 122 as possible.

In the structure wherein the red light emitting diode part 104 includes the UV light emitting diode chip instead of the blue light emitting diode chip 122, the color filter 170 may block UV light emitted from the UV light emitting diode chip. As a result, the color filter can minimize discharge of UV light from the light emitting diode package.

The green light emitting diode part 106 includes a substrate 110, a green light emitting diode chip 126, a first substrate electrode 132, a second substrate electrode 134, and an insulating portion 140.

The green light emitting diode chip 126 includes a light emitting structure 29, an n-type electrode 31, a p-type electrode 33, an n-type bump 35, a p-type bump 37, and an encapsulation portion 39, in which the light emitting structure 29 includes an n-type semiconductor layer 23, an active layer 25, and a p-type semiconductor layer 27. The light emitting structure 29 of the green light emitting diode chip 126 may be formed of an AlInGaN-based nitride semiconductor and the composition of the active layer 25 may be determined such that the green light emitting diode chip 126 can emit light having a peak wavelength in the green wavelength band.

The blue light emitting diode part 102, the red light emitting diode part 104 and the green light emitting diode part 106 are arranged on an upper surface of the circuit board 200, which supports the blue light emitting diode part 102, the red light emitting diode part 104 and the green light emitting diode part 106. In addition, the circuit board 200 may include a plurality of interconnection lines to supply electric power from an external power source to the blue light emitting diode part 102, the red light emitting diode part 104 and the green light emitting diode part 106.

In this exemplary embodiment, the circuit board 200 may be a printed the circuit board 200 or a TFT substrate including a plurality of TFT drive circuits therein. In the structure wherein the circuit board 200 is the TFT substrate, the TFT drive circuits of the TFT substrate may be electrically connected to the blue light emitting diode part 102, the red light emitting diode part 104 and the green light emitting diode part 106, respectively. As a result, the blue light emitting diode part 102, the red light emitting diode part 104 and the green light emitting diode part 106 can be independently driven by the TFT drive circuits.

Alternatively, the circuit board 200 may be a flexible printed circuit board or a flexible TFT substrate.

Figure 6:
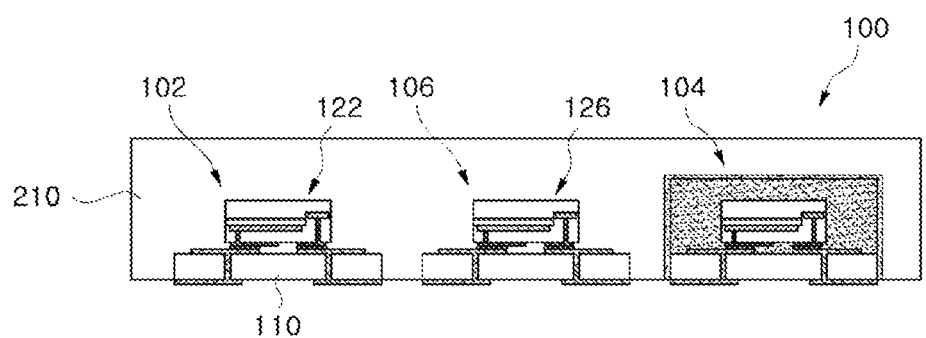
FIG. 6 is a sectional view of part of a display apparatus according to a fourth exemplary embodiment of the present invention.

FIG. 6 is a sectional view of part of a display apparatus according to a fourth exemplary embodiment of the present invention.

Referring to FIG. 6, the display apparatus 100 according to the fourth exemplary embodiment includes a blue light emitting diode part 102, a red light emitting diode part 104, a green light emitting diode part 106, and a coupling structure 210.

The blue light emitting diode part 102 includes a substrate 110, a blue light emitting diode chip 122, a first substrate electrode 132, and a second substrate electrode 134. The red light emitting diode part 104 includes a substrate 110, a blue light emitting diode chip 122, a first substrate electrode 132, a second substrate electrode 134, a phosphor portion 160, and a color filter 170. The green light emitting diode part 106 includes a substrate 110, a green light emitting diode chip 126, a first substrate electrode 132, and a second substrate electrode 134.

The blue light emitting diode part 102 and the green light emitting diode part 106 according to this exemplary embodiment are the same as those of the display apparatus according to the third exemplary embodiment excluding the insulating portion 140, and detailed description thereof will be omitted. The red light emitting diode part 104 according to this exemplary embodiment is the same as that of the display apparatus according to the third exemplary embodiment, and detailed description thereof will be omitted.

Unlike the third exemplary embodiment, each of the blue light emitting diode part 102 and the green light emitting diode part 106 does not include the insulating portion 140, as described above. The blue light emitting diode part 102, the red light emitting diode part 104 and the green light emitting diode part 106 are spaced apart from one another, and the coupling structure 210 is disposed to cover all of the blue light emitting diode part 102, the red light emitting diode part 104 and the green light emitting diode part 106.

The coupling structure 210 fills spaces between the blue light emitting diode part 102, the red light emitting diode part 104 and the green light emitting diode part 106, and couples the blue light emitting diode part 102, the red light emitting diode part 104 and the green light emitting diode part 106 to form an integrated structure.

According to this embodiment, the coupling structure 210 may be formed of a transparent material or a translucent material, like the insulating portion 140 of the third exemplary embodiment. For example, the coupling structure 210 may include at least one of polydimethylsiloxane (PDMS), polyimide, poly(methyl methacrylate) (PMMA), a ceramic material, an epoxy resin, and a synthetic resin.

Figure 7:
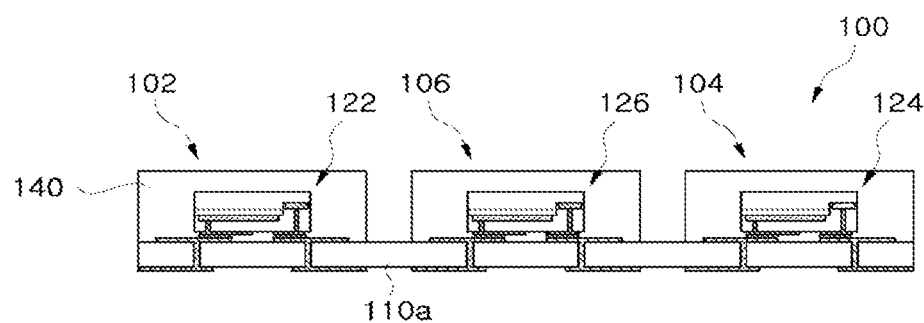
FIG. 7 is a sectional view of part of a display apparatus according to a fifth exemplary embodiment of the present invention.

FIG. 7 is a sectional view of part of a display apparatus according to a fifth exemplary embodiment of the present invention.

Referring to FIG. 7, the display apparatus 100 according to the third exemplary embodiment includes a coupling substrate 110a, a blue light emitting diode part 102, a red light emitting diode part 104, and a green light emitting diode part 106.

The coupling substrate 110a has a substrate including a plurality of substrates 110 according to the third exemplary embodiment coupled to each other, and is provided with a plurality of first substrate electrodes 132 and a plurality of second substrate electrodes 134. The first substrate electrodes 132 and the second substrate electrodes 134 have the same structure as those of the third exemplary embodiment and are arranged on the coupling substrate 110a such that plural pairs of first and second substrate electrodes 132, 134 are arranged on the coupling substrate 110a. Here, the plural pairs of first and second substrate electrodes are regularly arranged in rows and columns on the coupling substrate 110a.

The blue light emitting diode part 102, the red light emitting diode part 104 and the green light emitting diode part 106 are electrically connected to each of the first substrate electrodes 132 and each of the second substrate electrodes 134. That is, each of the blue light emitting diode part 102, the red light emitting diode part 104 and the green light emitting diode part 106 may be provided in plural, and the plurality of blue light emitting diode parts 102, the plurality of red light emitting diode parts 104 and the plurality of green light emitting diode parts 106 may be arranged in rows and columns on the coupling substrate 110a.

In this exemplary embodiment, each of the blue light emitting diode parts 102 includes a blue light emitting diode chip 122 and an insulating portion 140, and each of the red light emitting diode parts 104 includes a red light emitting diode chip 124 and an insulating portion 140. In addition, each of the green light emitting diode parts 106 includes a green light emitting diode chip 126 and an insulating portion 140.

In the blue light emitting diode part 102, the blue light emitting diode chip 122 may be coupled to the first substrate electrode 132 and the second substrate electrode 134, and the insulating portion 140 may be disposed to cover the blue light emitting diode chip 122, the first substrate electrode 132 and the second substrate electrode 134. The blue light emitting diode chip 122 may have the same structure as that of the third exemplary embodiment, and an n-type bump 35 and a p-type bump 37 may be exposed on a lower surface of the insulating portion 140. Accordingly, the n-type bump 35 and the p-type bump 37 may be electrically connected to the first substrate electrode 132 and the second substrate electrode 134, respectively.

The insulating portion 140 is disposed such that the n-type bump 35 and the p-type bump 37 can be exposed on the lower surface thereof. With this structure, the insulating portion 140 may be disposed so as not to cover the first substrate electrode 132 and the second substrate electrode 134.

Each of the red light emitting diode parts 104 includes a red light emitting diode chip 124 and an insulating portion 140. The red light emitting diode chip 124 may include a light emitting structure 29, an n-type electrode 31, a p-type electrode 33, an n-type bump 35, a p-type bump 37, and an encapsulation portion 39. The light emitting structure 29 may include an n-type semiconductor layer 23, an active layer 25, and a p-type semiconductor layer 27. The light emitting structure 29 may be formed of an AlInGaP-based nitride semiconductor. In this exemplary embodiment, the composition of the active layer 25 may be determined such that the red light emitting diode chip 124 can emit light having a peak wavelength in the red wavelength band.

The arrangement of the red light emitting diode chip 124 and the insulating portion 140 may be the same as that of the blue light emitting diode part 102.

Each of the green light emitting diode parts 106 includes a green light emitting diode chip 126 and an insulating portion 140. The green light emitting diode chip 126 includes a light emitting structure 29, an n-type electrode 31, a p-type electrode 33, and an n-type bump 35. The light emitting structure 29 may include an n-type semiconductor layer 23, an active layer 25, and a p-type semiconductor layer 27. In this exemplary embodiment, the composition of the active layer 25 may be determined such that the green light emitting diode chip 126 can emit light having a peak wavelength in the green wavelength band. The light emitting structure 29 may be formed of an AlInGaN-based nitride semiconductor.

The arrangement of the green light emitting diode chip 126 and the insulating portion 140 may be the same as that of the blue light emitting diode part 102.

Figure 8:
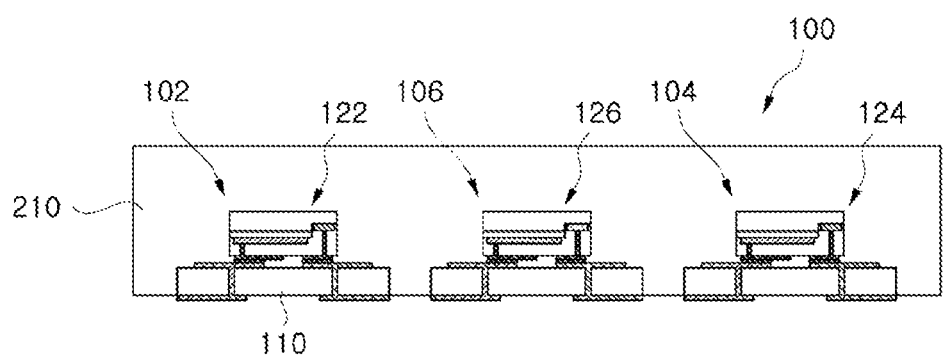
FIG. 8 is a sectional view of part of a display apparatus according to a sixth exemplary embodiment of the present invention.

FIG. 8 is a sectional view of part of a display apparatus according to a sixth exemplary embodiment of the present invention.

Referring to FIG. 8, the display apparatus 100 according to the sixth exemplary embodiment includes a blue light emitting diode part 102, a red light emitting diode part 104, a green light emitting diode part 106, and a coupling structure 210.

The blue light emitting diode part 102 and the green light emitting diode part 106 are the same as those of the fifth exemplary embodiment, and detailed description thereof will be omitted.

The red light emitting diode part 104 includes a substrate 110, a red light emitting diode chip 124, a first substrate electrode 132, and a second substrate electrode 134. As in the blue light emitting diode part 102 according to the third exemplary embodiment, the first substrate electrode 132 and the second substrate electrode 134 according to this exemplary embodiment are coupled to the substrate 110, and the red light emitting diode chip 124 is electrically coupled to the first substrate electrode 132 and the second substrate electrode 134 on the substrate 110. The red light emitting diode chip 124 may have the same structure and composition as that of the red light emitting diode package according to the third exemplary embodiment.

With the blue light emitting diode part 102, the red light emitting diode part 104 and the green light emitting diode part 106 arranged as shown in FIG. 8, the coupling structure 210 is disposed to cover the blue light emitting diode part 102, the red light emitting diode part 104 and the green light emitting diode part 106. As in the fourth exemplary embodiment, the coupling structure 210 fills spaces between the blue light emitting diode part 102, the red light emitting diode part 104 and the green light emitting diode part 106, and serves to couple the blue light emitting diode part 102, the red light emitting diode part 104 and the green light emitting diode part 106 to form an integrated structure.

According to this embodiment, the coupling structure 210 may be formed of a transparent material or a translucent material. For example, the coupling structure 210 may include at least one of polydimethylsiloxane (PDMS), polyimide, poly(methyl methacrylate) (PMMA), a ceramic material, an epoxy resin, and a synthetic resin.

Figure 9:
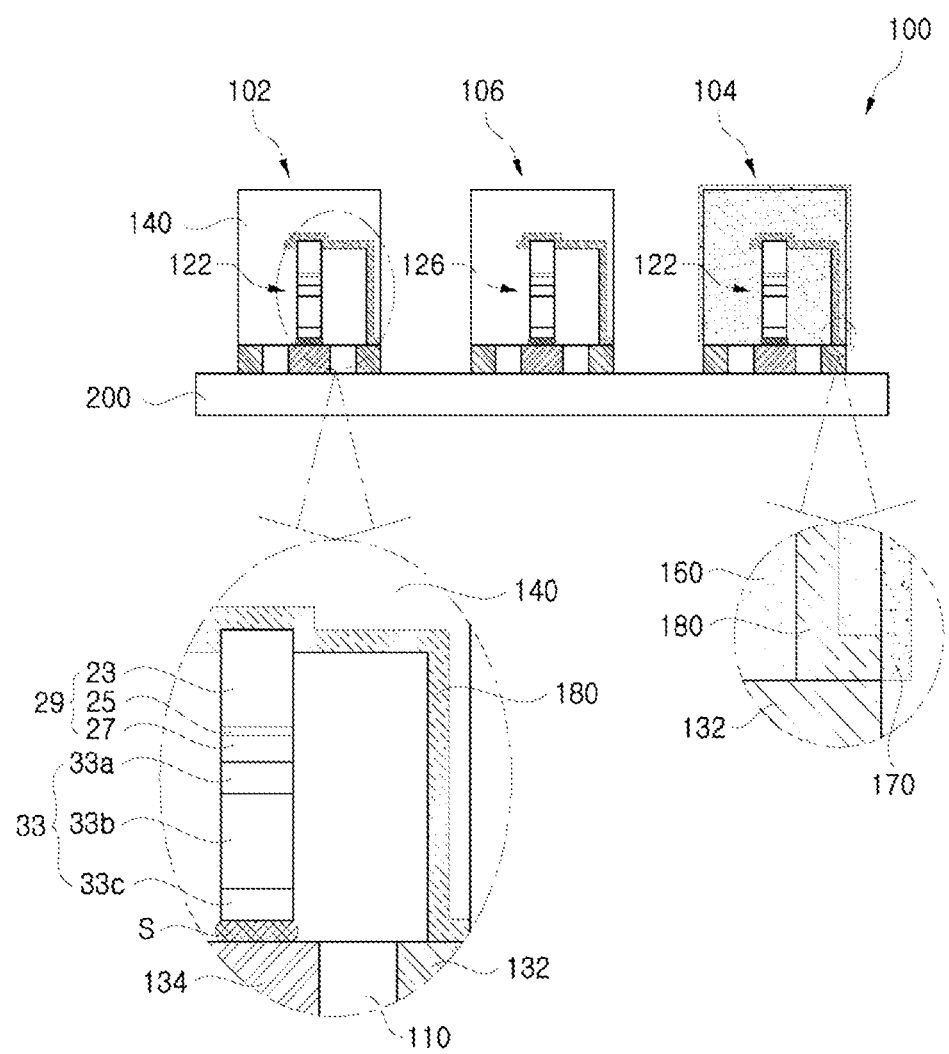
FIG. 9 is a sectional view of part of a display apparatus according to a seventh exemplary embodiment of the present invention.

FIG. 9 is a sectional view of part of a display apparatus according to a seventh exemplary embodiment of the present invention.

Referring to FIG. 9, the display apparatus 100 according to the seventh exemplary embodiment includes a blue light emitting diode part 102, a red light emitting diode part 104, a green light emitting diode part 106, and a circuit board 200.

The blue light emitting diode part 102 includes a substrate 110, a blue light emitting diode chip 122, a first substrate electrode 132, a second substrate electrode 134, an insulating portion 140, and a connection electrode 180.

The substrate 110 supports the blue light emitting diode part 102, and may include an insulating material and have a predetermined thickness.

As shown in FIG. 9, the blue light emitting diode chip 122 has a vertical structure and may include a light emitting structure 29 and a p-type electrode 33. Here, the light emitting structure 29 may include an n-type semiconductor layer 23, an active layer 25, and a p-type semiconductor layer 27.

The light emitting structure 29 includes a p-type semiconductor layer 27 disposed at a lower side thereof, an n-type semiconductor layer 23 disposed at an upper surface thereof, and an active layer 25 interposed between the p-type semiconductor layer 27 and the n-type semiconductor layer 23. Although an n-type electrode 31 may be disposed on an upper surface of the n-type semiconductor layer 23, description of the n-type electrode 31 is omitted in this exemplary embodiment. According to this exemplary embodiment, the light emitting structure 29 may be an AlInGaN-based nitride semiconductor.

The p-type electrode 33 is disposed on a lower surface of the p-type semiconductor layer 27 and includes first to third electrode portions 33a, 33b, 33c. The first electrode portion 33a electrically contacts the p-type electrode 33, and the second electrode portion 33b and the third electrode portion 33c are sequentially disposed on a lower side of the first electrode portion 33a. In this exemplary embodiment, the first electrode portion 33a may include gold (Au), the second electrode portion 33b may include aluminum (Al), and the third electrode portion 33c may include silver (Ag).

Although the p-type electrode 33 according to this exemplary embodiment has a multilayer structure including the first to third electrode portions 33a, 33b, 33c, the p-type electrode 33 may have a monolayer structure, as needed, and the p-type electrode 33 may have a thinner thickness than that shown in FIG. 9.

In this exemplary embodiment, the light emitting structure 29 is disposed on the first substrate electrode 132 and the p-type electrode 33 of the light emitting structure 29 is electrically connected to the first substrate electrode 132. Here, the p-type electrode 33 may be coupled to the first substrate electrode 132 by a bonding portion S.

In addition, the connection electrode 180 is disposed to cover the upper surface of the n-type semiconductor layer 23. The connection electrode 180 electrically connects the n-type semiconductor layer 23 to the second substrate electrode 134 and may include a transparent material, for example, ITO or ZnO, to allow light emitted from the blue light emitting diode chip 122 to pass therethrough.

The first substrate electrode 132 and the second substrate electrode 134 are disposed under the blue light emitting diode chip 122 and are spaced apart from each other so as to be electrically insulated from each other. The first substrate electrode 132 is electrically connected to the p-type electrode 33 and the second substrate electrode 134 is electrically connected to the n-type semiconductor layer 23 through the connection electrode 180.

The insulating portion 140 is disposed to cover the blue light emitting diode chip 122. The insulating portion 140 serves to protect the blue light emitting diode chip 122 and the connection electrode 180 from external environments and to prevent electric short due to foreign matter. In this exemplary embodiment, the insulating portion 140 may be formed of a transparent material or a translucent material to allow light emitted from the blue light emitting diode chip 122 to be discharged outside therethrough. For example, the insulating portion 140 may include at least one of polydimethylsiloxane (PDMS), polyimide, poly(methyl methacrylate) (PMMA), and a ceramic material.

The red light emitting diode part 104 includes a substrate 110, a blue light emitting diode chip 122, a first substrate electrode 132, a second substrate electrode 134, a phosphor portion 160, a color filter 170, and a connection electrode 180. In this exemplary embodiment, the substrate 110, the blue light emitting diode chip 122, the first substrate electrode 132 and the second substrate electrode 134 are the same as those of the blue light emitting diode part 102 according to the third exemplary embodiment.

As in the insulating portion 140 of the blue light emitting diode part 102, the phosphor portion 160 may be disposed to cover the blue light emitting diode chip 122, the connection electrode 180 and an upper surface of the substrate 110. The phosphor portion 160 may contain at least one type of phosphor. Specifically, the phosphor portion 160 may contain a phosphor capable of emitting red light through wavelength conversion of blue light emitted from the blue light emitting diode chip 122.

Although the red light emitting diode part 104 includes the blue light emitting diode chip 122 in this exemplary embodiment, the red light emitting diode part 104 may include a UV light emitting diode chip, as needed. In the structure wherein the red light emitting diode part 104 includes the UV light emitting diode chip, the phosphor portion 160 may contain a phosphor capable of emitting red light through wavelength conversion of UV light emitted from the UV light emitting diode chip 122.

According to this exemplary embodiment, the phosphor portion 160 may include at least one type of phosphor together with at least one of polydimethylsiloxane (PDMS), polyimide, poly(methyl methacrylate) (PMMA), and a ceramic material, which are transparent or translucent materials.

The color filter 170 may be disposed to cover upper and side surfaces of the phosphor portion 160 and the side surface of the substrate 110. The color filter 170 serves to block light in a predetermined range of wavelengths among light emitted through the phosphor portion 160. In this exemplary embodiment, the color filter 170 blocks blue light emitted from the blue light emitting diode chip 122 while allowing red light emitted from the phosphor portion 160 through wavelength conversion to pass therethrough. Accordingly, the color filter 170 can minimize discharge of blue light from the light emitting diode package. That is, the color filter 170 is provided to the light emitting diode package in order to maximize the ratio of light subjected to wavelength conversion by the phosphor portion 160 to light emitted through the color filter 170.

The color filter 170 may have as small a thickness as possible on the upper and side surfaces of the phosphor portion 160 while blocking as much blue light emitted from the blue light emitting diode chip 122 as possible.

In the structure wherein the red light emitting diode part 104 includes the UV light emitting diode chip instead of the blue light emitting diode chip 122, the color filter 170 may block UV light emitted from the UV light emitting diode chip. As a result, the color filter can minimize discharge of UV light from the light emitting diode package.

The green light emitting diode part 106 includes a substrate 110, a green light emitting diode chip 126, a first substrate electrode 132, a second substrate electrode 134, and a connection electrode 180.

The green light emitting diode chip 126 includes a light emitting structure 29 and a p-type electrode 33, in which the light emitting structure 29 includes an n-type semiconductor layer 23, an active layer 25, and a p-type semiconductor layer 27. The light emitting structure 29 of the green light emitting diode chip 126 may be formed of an AlInGaN-based nitride semiconductor and the composition of the active layer 25 may be determined such that the green light emitting diode chip 126 can emit light having a peak wavelength in the green wavelength band.

In this exemplary embodiment, the green light emitting diode part 106 has the same structure as the blue light emitting diode part 102 except for the use of the green light emitting diode chip 126, and thus detailed description thereof will be omitted.

The blue light emitting diode part 102, the red light emitting diode part 104 and the green light emitting diode part 106 are arranged on an upper surface of the circuit board 200. The circuit board 200 according to this exemplary embodiment may be the same as the circuit board according to the third exemplary embodiment.

Figure 10:
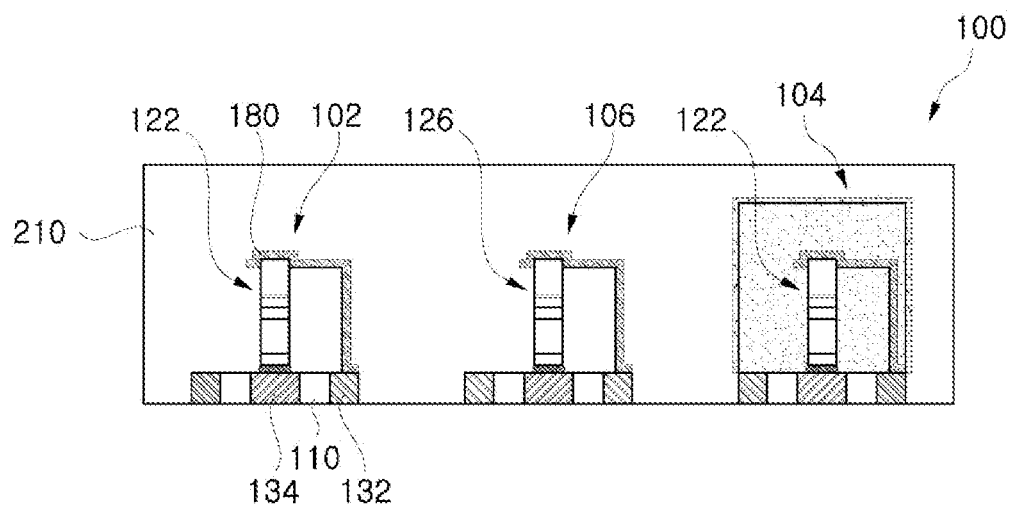
FIG. 10 is a sectional view of part of a display apparatus according to an eighth exemplary embodiment of the present invention.

FIG. 10 is a sectional view of part of a display apparatus according to an eighth exemplary embodiment of the present invention.

Referring to FIG. 10, the display apparatus 100 according to the eighth exemplary embodiment includes a blue light emitting diode part 102, a red light emitting diode part 104, a green light emitting diode part 106, and a coupling structure 210.

The blue light emitting diode part 102 includes a substrate 110, a blue light emitting diode chip 122, a first substrate electrode 132, a second substrate electrode 134, and a connection electrode 180. The red light emitting diode part 104 includes a substrate 110, a blue light emitting diode chip 122, a first substrate electrode 132, a second substrate electrode 134, a phosphor portion 160, a color filter 170, and a connection electrode 180. The green light emitting diode part 106 includes a substrate 110, a green light emitting diode chip 126, a first substrate electrode 132, a second substrate electrode 134, and a connection electrode 180.

According to this exemplary embodiment, the blue light emitting diode part 102 and the green light emitting diode part 106 are the same as those of the display apparatus according to the fifth exemplary embodiment except for the insulating portion 140, and thus detailed description thereof will be omitted. The red light emitting diode part 104 according to this exemplary embodiment is the same as that of the display apparatus according to third exemplary embodiment, and detailed description thereof will be omitted.

The blue light emitting diode part 102, the red light emitting diode part 104 and the green light emitting diode part 106 are spaced apart from one another, and the coupling structure 210 is disposed to cover all of the blue light emitting diode part 102, the red light emitting diode part 104 and the green light emitting diode part 106.

The coupling structure 210 fills spaces between the blue light emitting diode part 102, the red light emitting diode part 104 and the green light emitting diode part 106, and couples the blue light emitting diode part 102, the red light emitting diode part 104 and the green light emitting diode part 106 to form an integrated structure.

According to this embodiment, the coupling structure 210 may be formed of a transparent material or a translucent material, like the insulating portion 140 of the third exemplary embodiment. For example, the coupling structure 210 may include at least one of polydimethylsiloxane (PDMS), polyimide, poly(methyl methacrylate) (PMMA), a ceramic material, an epoxy resin, and a synthetic resin.

Figure 11:
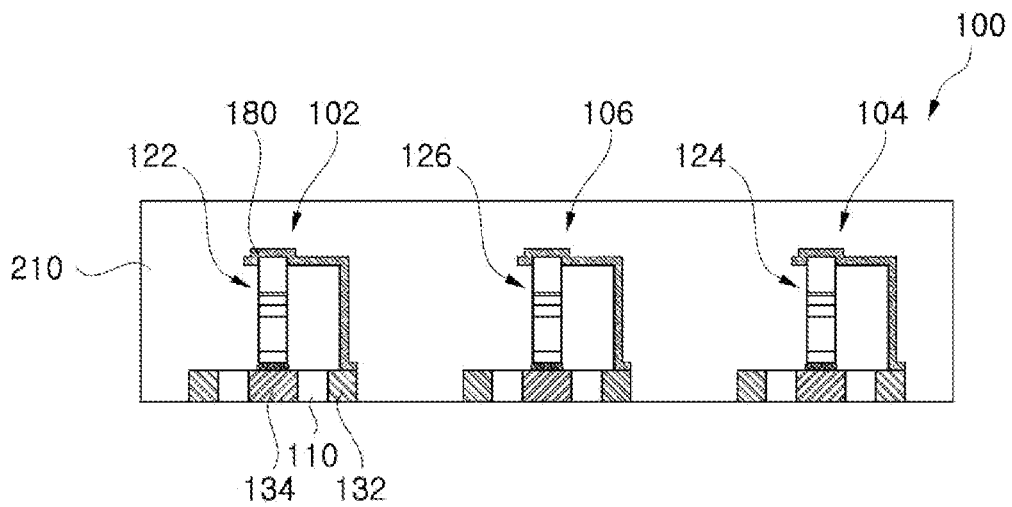
FIG. 11 is a sectional view of part of a display apparatus according to a ninth exemplary embodiment of the present invention.

FIG. 11 is a sectional view of part of a display apparatus according to a ninth exemplary embodiment of the present invention.

Referring to FIG. 11, the display apparatus 100 according to the ninth exemplary embodiment includes a blue light emitting diode part 102, a red light emitting diode part 104, a green light emitting diode part 106, and a coupling structure 210.

The blue light emitting diode part 102 and the green light emitting diode part 106 are the same as those of the eighth exemplary embodiment, and detailed description thereof will be omitted.

The red light emitting diode part 104 includes a substrate 110, a red light emitting diode chip 124, a first substrate electrode 132, a second substrate electrode 134, and a connection electrode 180. As in the blue light emitting diode part 102, the first substrate electrode 132 and the second substrate electrode 134 according to this exemplary embodiment are coupled to the substrate 110, and the red light emitting diode chip 124 is electrically coupled to the first substrate electrode 132 and the second substrate electrode 134.

The red light emitting diode chip 124 includes a light emitting structure 29 and a p-type electrode 33, in which the light emitting structure 29 includes an n-type electrode 31, an active layer 25 and a p-type electrode 33. The light emitting structure 29 of the red light emitting diode chip 124 may be formed of an AlInGaP-based nitride semiconductor and the composition of the active layer 25 may be determined such that the red light emitting diode chip 124 can emit light having a peak wavelength in the red wavelength band.

With the blue light emitting diode part 102, the red light emitting diode part 104 and the green light emitting diode part 106 arranged as shown in FIG. 11, the coupling structure 210 is disposed to cover the blue light emitting diode part 102, the red light emitting diode part 104 and the green light emitting diode part 106. As in the eighth exemplary embodiment, the coupling structure 210 fills spaces between the blue light emitting diode part 102, the red light emitting diode part 104 and the green light emitting diode part 106, and couples the blue light emitting diode part 102, the red light emitting diode part 104 and the green light emitting diode part 106 to form an integrated structure.

According to this exemplary embodiment, the coupling structure 210 may be formed of a transparent material or a translucent material. For example, the coupling structure 210 may include at least one of polydimethylsiloxane (PDMS), polyimide, poly(methyl methacrylate) (PMMA), a ceramic material, an epoxy resin, and a synthetic resin.

Figure 12:
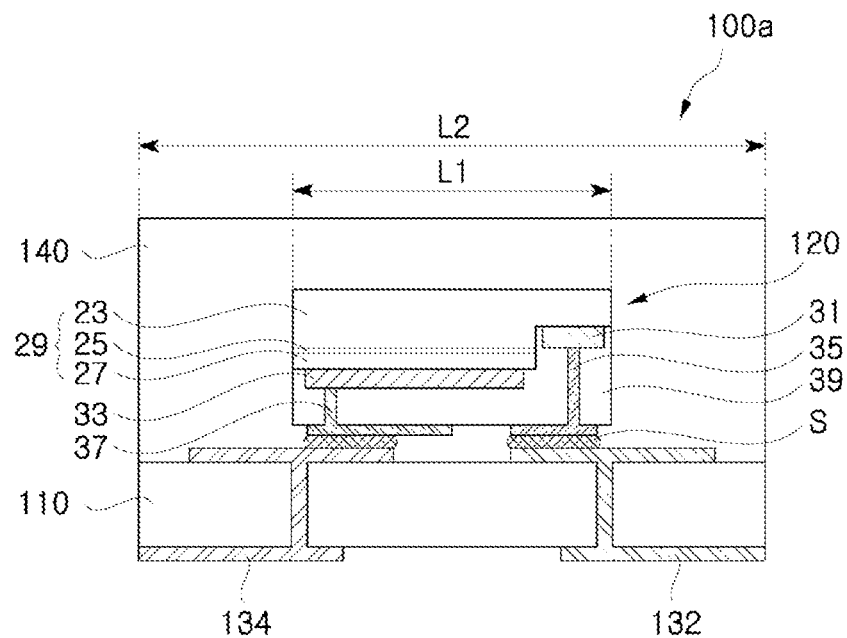
FIG. 12 is a sectional view of a light emitting diode package according to a tenth exemplary embodiment of the present invention.

FIG. 12 is a sectional view of a light emitting diode package according to a tenth exemplary embodiment of the present invention.

Referring to FIG. 12, a light emitting diode part 100a according to the tenth exemplary embodiment includes a substrate 110, a light emitting diode chip 120, a first substrate electrode 132, a second substrate electrode 134, and an insulating portion 140.

The substrate 110 supports the light emitting diode part 100a and the light emitting diode chip 120. In this exemplary embodiment, the substrate 110 may be formed of an insulating material and have a predetermined thickness.

The light emitting diode chip 120 is disposed on the substrate 110 and may emit light upon receiving power from an external power source. As shown in FIG. 12, the light emitting diode chip 120 may include a light emitting structure 29, an n-type electrode 31, a p-type electrode 33, an n-type bump 35, a p-type bump 37, and an encapsulation portion 39. The light emitting structure 29 may include an n-type semiconductor layer 23, an active layer 25, and a p-type semiconductor layer 27.

Each of the n-type semiconductor layer 23, the active layer 25 and the p-type semiconductor layer 27 may include Group III-V based compound semiconductors. By way of example, each of the n-type semiconductor layer 23, the active layer 25 and the p-type semiconductor layer 27 may include nitride semiconductors such as (Al, Ga, In) N. The n-type semiconductor layer 23 may be interchangeably placed with the p-type semiconductor layer 27.

The n-type semiconductor layer 23 may be a conductive semiconductor layer containing n-type dopants (for example, Si), and the p-type semiconductor layer 27 may be a conductive semiconductor layer containing p-type dopants (for example, Mg). The active layer 25 is interposed between the n-type semiconductor layer 23 and the p-type semiconductor layer 27, and may include a multi-quantum well (MQW) structure. The composition of the active layer 25 may be determined to emit light having a desired peak wavelength.

In this exemplary embodiment, the light emitting diode chip 120 may emit blue light or green light. In this case, the light emitting structure 29 may be an AlInGaN-based nitride semiconductor. Alternatively, the light emitting structure 29 may emit red light. In this case, the light emitting structure 29 may be an AlGaInP-based nitride semiconductor.

Referring to FIG. 12, in the light emitting structure 29 according to this exemplary embodiment, the active layer 25 and the n-type semiconductor layer 23 are sequentially disposed on the p-type semiconductor layer 27 in the stated order. In addition, a portion of the n-type semiconductor layer 23 may be exposed by partially removing the p-type semiconductor layer 27 and the active layer 25.

The p-type electrode 33 is disposed on a lower surface of the p-type semiconductor layer 27 to be electrically connected to the p-type semiconductor layer 27, and the n-type electrode 31 is disposed on the exposed portion of the n-type semiconductor layer 23 to be electrically connected to the n-type semiconductor layer 23. That is, in this exemplary embodiment, the light emitting diode chip 120 may be a horizontal type light emitting diode chip 120 in which the n-type electrode 31 and the p-type electrode 33 are arranged in the same direction.

The encapsulation portion 39 may be disposed on the lower surface of the light emitting structure 29 to cover the n-type electrode 31, the p-type electrode 33 and the light emitting structure 29. The encapsulation portion 39 exhibits electrically insulating properties and can protect the light emitting structure 29, the n-type electrode 31 and the p-type electrode 33 from external environments. In this exemplary embodiment, the encapsulation portion 39 may be formed of a transparent material. Alternatively, the encapsulation portion 39 may be formed of an opaque material or a translucent material, as needed. Here, the encapsulation portion 39 may have the same width as the light emitting structure 29.

Each of the n-type bump 35 and the p-type bump 37 may be disposed to cover a portion of a lower surface of the encapsulation portion 39. In addition, the n-type bump 35 may be electrically connected to the n-type electrode 31 and the p-type bump 37 may be electrically connected to the p-type electrode 33 through via-holes formed in the encapsulation portion 39. The n-type bump 35 and the p-type bump 37 are spaced apart from each other on the lower surface of the encapsulation portion 39 to be electrically insulated from each other.

The first substrate electrode 132 and the second substrate electrode 134 are provided to the substrate 110. The first substrate electrode 132 extends from an upper surface of the substrate 110 to a lower surface thereof through the substrate 110. That is, a portion of the first substrate electrode 132 is disposed on the upper surface of the substrate 110 and another portion of the first substrate electrode 132 is disposed on the lower surface of the substrate 110 such that both portions of the first substrate electrode 132 are electrically connected to each other through a via-hole formed in the substrate 110. Like the first substrate electrode 132, portions of the second substrate electrode 134 are disposed on the upper and lower surfaces of the substrate 110, respectively, and are electrically connected to each other through a via-hole formed in the substrate 110. In this exemplary embodiment, the first substrate electrode 132 may be spaced apart from the second substrate electrode 134 to be electrically insulated from each other.

The portions of the first substrate electrode 132 and the second substrate electrode 134 disposed on the upper surface of the substrate 110 may be electrically connected to the n-type bump 35 and the p-type bump 37 of the light emitting diode chip 120, and may be bonded thereto by a bonding portion S. That is, the light emitting diode chip 120 is disposed on the substrate 110 such that the n-type bump 35 and the p-type bump 37 disposed on the lower surface of the light emitting diode chip 120 are electrically connected to the first substrate electrode 132 and the second substrate electrode 134, respectively.

The insulating portion 140 may be disposed to cover the light emitting diode chip 120 and the upper surface of the substrate 110. The insulating portion 140 serves to protect the light emitting structure 29 of the light emitting diode chip 120 from external environments and to prevent electric short due to foreign matter. In this exemplary embodiment, the insulating portion 140 may be formed of a transparent material or a translucent material to allow light emitted from the light emitting diode chip 120 to be discharged outside therethrough. For example, the insulating portion 140 may include at least one of polydimethylsiloxane (PDMS), polyimide, poly(methyl methacrylate) (PMMA), and a ceramic material.

In this exemplary embodiment, since the light emitting diode chip 120 has a predetermined width L1 or less, the light emitting diode chip 120 is used in a state of being mounted on the substrate 110. For example, the light emitting diode chip 120 may have a width L1 of 200 µm or less, specifically 50 µm or less, or 10 µm or less.

In the related art, since light emitting diode chips 120 having a small width L1 are used, it is not easy to mount each of the light emitting diode chips 120 on a printed circuit board and to replace the light emitting diode chip 120 mounted on the printed circuit board due to failure of the light emitting diode chip 120. According to this exemplary embodiment, the light emitting diode part 100a may have a width L2 of 150 µm or more, which is the minimum width for a manufacturing process thereof, preferably greater than 200 µm. Accordingly, the light emitting diode part 100a can be relatively large while reducing the luminous area of the light emitting diode part 100a.

Furthermore, the size of the light emitting diode chip 120 can be reduced while reducing the luminous area of the light emitting diode part 100a, thereby reducing manufacturing costs of the light emitting diode part 100a.

Figure 13:
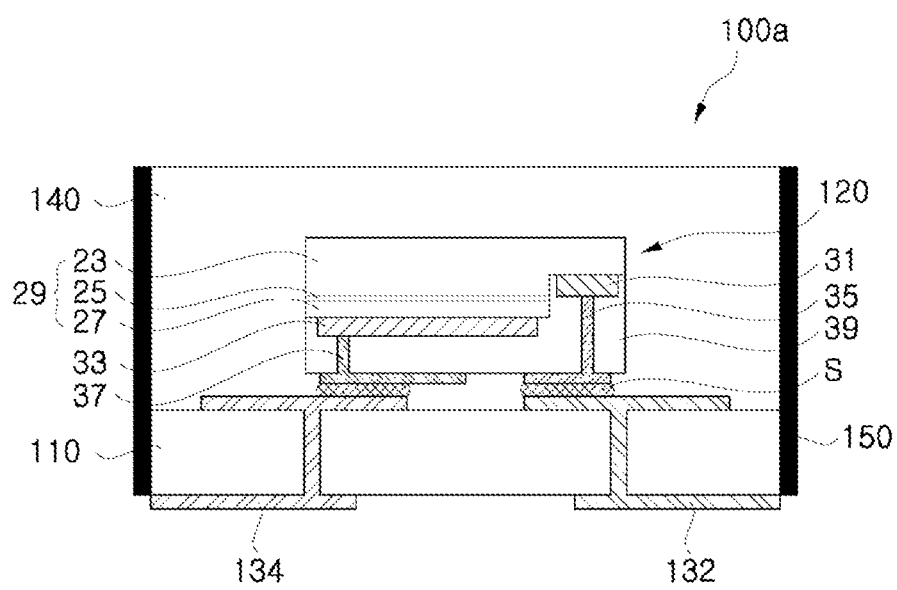
FIG. 13 is a sectional view of a light emitting diode package according to a eleventh exemplary embodiment of the present invention.

FIG. 13 is a sectional view of a light emitting diode package according to an eleventh exemplary embodiment of the present invention.

Referring to FIG. 13, a light emitting diode part 100a according to the eleventh exemplary embodiment includes a substrate 110, a light emitting diode chip 120, a first substrate electrode 132, a second substrate electrode 134, an insulating portion 140, and a reflective portion 150. Descriptions of the same components as the tenth exemplary embodiment will be omitted herein.

In this exemplary embodiment, the substrate 110, the light emitting diode chip 120, the first substrate electrode 132, the second substrate electrode 134, and the insulating portion 140 are the same as those of the light emitting diode package according to the tenth exemplary embodiment.

The reflective portion 150 is disposed to surround side surfaces of the substrate 110 and the insulating portion 140. The reflective portion 150 serves to reflect light traveling in a lateral direction of the light emitting diode package when the light emitted from the light emitting diode chip 120 is discharged through the insulating portion 140. Thus, the reflective portion 150 may include an opaque material having high reflectivity while providing less light loss. In addition, the reflective portion 150 may be coated with a high reflectivity (HR) material, as needed. Here, the HR material may be silver (Ag) or a stacked layer of TiO2/SiO2.

When light emitted from the light emitting diode chip 120 is discharged through side surfaces of plural light emitting diode packages 100 mounted on a printed circuit board, there can be a disturbance in mixture of different colors emitted from the light emitting diode packages 100.

That is, in a structure wherein a blue light emitting diode part 100a, a red light emitting diode part 100a and a green light emitting diode part 100a are mounted on the printed circuit board, white light can be realized through mixture of light emitted from these light emitting diode packages 100. Here, when light is emitted from the side surfaces of the light emitting diode packages 100, uneven mixing of the light emitted from the light emitting diode packages 100 occurs, thereby causing deterioration in color reproduction.

According to this exemplary embodiment, the reflective portion 150 is disposed to surround the side surfaces of the substrate 110 and the insulating portion 140 to reflect light emitted from the light emitting diode part 100a in an upward direction.

Figure 14:
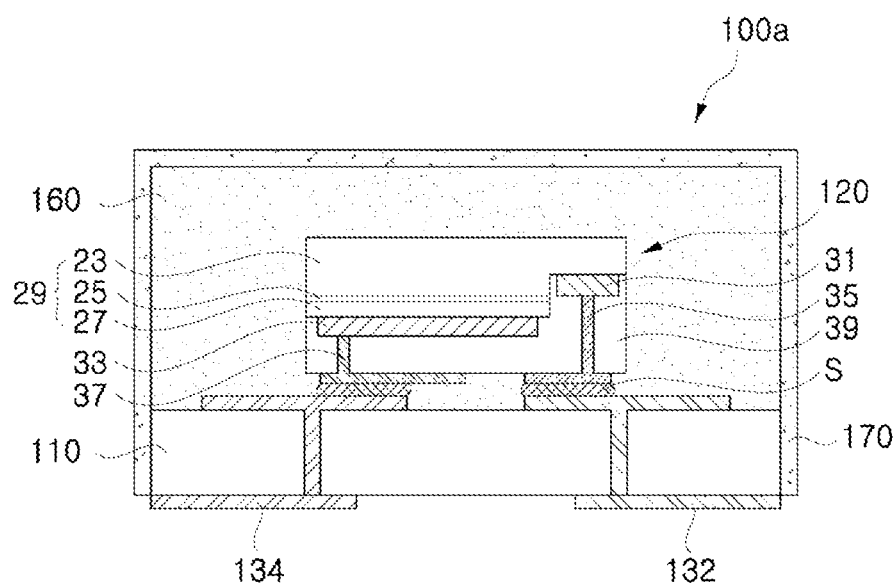
FIG. 14 is a sectional view of a light emitting diode package according to a twelfth exemplary embodiment of the present invention.

FIG. 14 is a sectional view of a light emitting diode package according to a twelfth exemplary embodiment of the present invention.

Referring to FIG. 14, a light emitting diode part 100a according to the twelfth exemplary embodiment includes a substrate 110, a light emitting diode chip 120, a first substrate electrode 132, a second substrate electrode 134, a phosphor portion 160, and a color filter 170.

In this exemplary embodiment, the substrate 110, the light emitting diode chip 120, the first substrate electrode 132, and the second substrate electrode 134 are the same as those of the light emitting diode package according to the tenth exemplary embodiment, and thus descriptions thereof will be omitted herein The phosphor portion 160 may be disposed to cover the light emitting diode chip 120 and an upper surface of the substrate 110. The phosphor portion 160 may contain at least one type of phosphor. In this exemplary embodiment, the light emitting diode chip 120 may be a blue or UV light emitting diode chip.

Accordingly, the phosphor portion 160 may emit red light or green light through wavelength conversion of blue or UV light emitted from a blue light emitting diode chip or a UV light emitting diode chip. In order to allow the phosphor portion 160 to emit red light, the phosphor portion 160 may contain a phosphor capable of emitting red light through wavelength conversion of blue light or UV light. In order to allow the phosphor portion 160 to emit green light, the phosphor portion 160 may contain a phosphor capable of emitting green light through wavelength conversion of blue light or UV light.

According to this exemplary embodiment, the phosphor portion 160 may include at least one type of phosphor together with a transparent material or a translucent material, which includes at least one of polydimethylsiloxane (PDMS), polyimide, poly(methyl methacrylate) (PMMA), and a ceramic material, as in the insulating portion 140 of the light emitting diode package according to the tenth exemplary embodiment.

The color filter 170 may be disposed to cover the phosphor portion 160 and the side surface of the substrate 110. As shown in FIG. 3, the color filter 170 covers upper and side surfaces of the phosphor portion 160 while covering the side surface of the substrate 110. The color filter 170 serves to block blue light or UV light emitted from the light emitting diode chip 120. Accordingly, the color filter 170 can minimize discharge of blue light or UV light from the light emitting diode package by blocking the blue light or the UV light emitted through the phosphor portion 160. That is, the color filter 170 is provided to the light emitting diode package in order to maximize the ratio of light subjected to wavelength conversion by the phosphor portion 160 to light emitted through the color filter 170.

Figure 15:
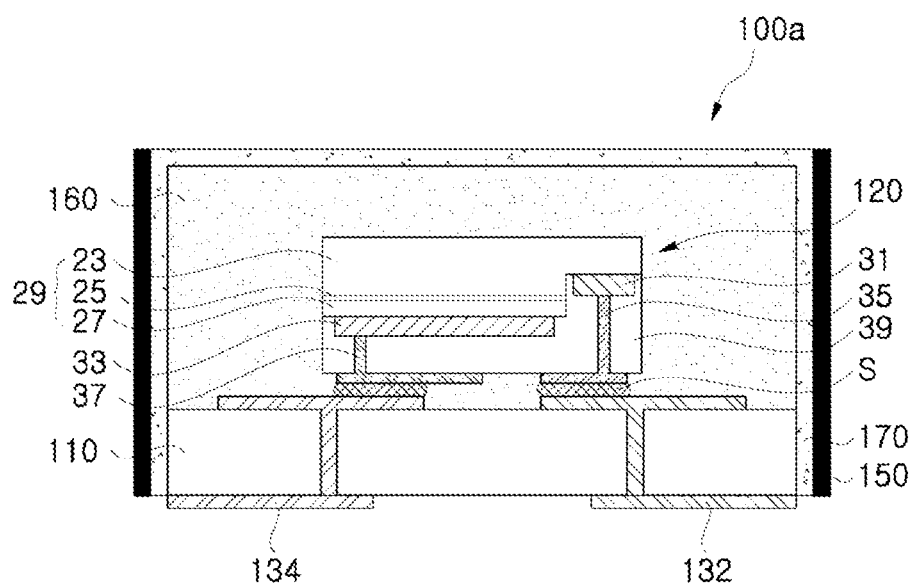
FIG. 15 is a sectional view of a light emitting diode package according to a thirteenth exemplary embodiment of the present invention.

FIG. 15 is a sectional view of a light emitting diode package according to a thirteenth exemplary embodiment of the present invention.

Referring to FIG. 15, a light emitting diode part 100a according to the thirteenth exemplary embodiment includes a substrate 110, a light emitting diode chip 120, a first substrate electrode 132, a second substrate electrode 134, a phosphor portion 160, a color filter 170, and a reflective portion 150.

In this exemplary embodiment, the substrate 110, the light emitting diode chip 120, the first substrate electrode 132, the second substrate electrode 134, the phosphor portion 160, and the color filter 170 are the same as those of the light emitting diode package according to the twelfth exemplary embodiment and thus descriptions thereof will be omitted herein.

The reflective portion 150 is disposed to surround a side surface of the color filter 170. The reflective portion 150 serves to reflect light traveling in a lateral direction of the light emitting diode package when the light emitted from the light emitting diode chip 120 is discharged through the phosphor portion 160 and the color filter 170. Thus, as in the eleventh exemplary embodiment, the reflective portion 150 may include an opaque material having high reflectivity while providing less light loss. In addition, the reflective portion 150 may be coated with a high reflectivity (HR) material, as needed.

Figure 16:
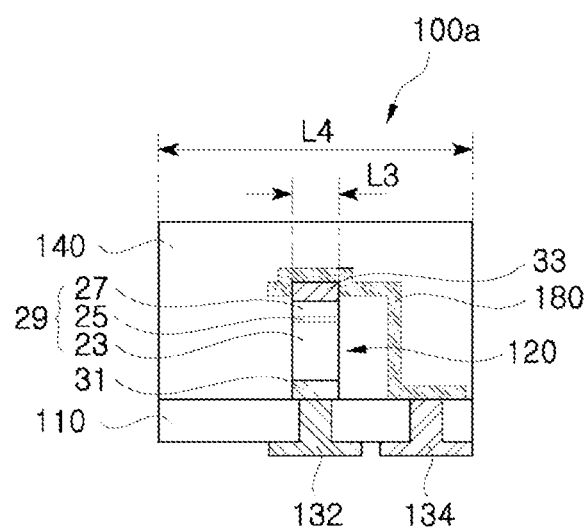
FIG. 16 is a sectional view of a light emitting diode package according to a fourteenth exemplary embodiment of the present invention.

FIG. 16 is a sectional view of a light emitting diode package according to a fourteenth exemplary embodiment of the present invention.

Referring to FIG. 16, a light emitting diode part 100a according to the fourteenth exemplary embodiment includes a substrate 110, a light emitting diode chip 120, a first substrate electrode 132, a second substrate electrode 134, an insulating portion 140, and a connection electrode 180.

In this exemplary embodiment, the substrate 110, the first substrate electrode 132 and the second substrate electrode 134 are the same as those of the light emitting diode package according to the tenth exemplary embodiment. In this exemplary embodiment, the substrate 110 may have a smaller size than the substrate of the tenth exemplary embodiment, and the distance between the first substrate electrode 132 and the second substrate electrode 134 may be smaller than that of the tenth exemplary embodiment. In addition, although the first substrate electrode 132 and the second substrate electrode 134 may not be disposed on the upper surface of the substrate 110, the first substrate electrode 132 and the second substrate electrode 134 may be exposed to the upper surface of the substrate 110, as needed.

The light emitting diode chip 120 may be disposed on the first substrate electrode 132 to be electrically connected to the first substrate electrode 132. Referring to FIG. 5, the light emitting diode chip 120 includes a light emitting structure 29, an n-type electrode 31 and a p-type electrode 33. In this exemplary embodiment, the light emitting structure 29 may include an n-type semiconductor layer 23, an active layer 25, and a p-type semiconductor layer 27.

In this exemplary embodiment, the light emitting diode chip 120 may be a vertical type light emitting diode chip in which the active layer 25 and the p-type semiconductor layer 27 are sequentially stacked on the n-type semiconductor layer 23 in the stated order. Here, the n-type semiconductor layer 23 may be interchangeable with the p-type semiconductor layer 27.

The n-type electrode 31 may be disposed on a lower surface of the n-type semiconductor layer 23 and the p-type electrode 33 may be disposed on an upper surface of the p-type semiconductor layer 27. The n-type electrode 31 electrically connects the first substrate electrode 132 to the n-type semiconductor layer 23. The p-type electrode 33 is disposed on an upper surface of the p-type semiconductor layer 27 and may include a transparent material. Although not shown in the drawings, the n-type electrode 31 may be coupled to the first substrate electrode 132 via a bonding portion S.

The connection electrode 180 may be disposed to cover the p-type electrode 33 and extend to be electrically connected to the second substrate electrode 134. That is, the connection electrode 180 electrically connects the p-type electrode 33 to the second substrate electrode 134. Thus, as shown in FIG. 5, the connection electrode 180 covers the p-type electrode 33, extends in one direction, is bent to extend downwards, and is bent and extends in one direction to be electrically connected to the second substrate electrode 134.

The connection electrode 180 may include a transparent material such as indium tin oxide (ITO) or ZnO to allow light emitted from the light emitting diode chip 120 to pass therethrough. Here, some portions of the connection electrode 180 may be formed of a transparent material and a portion of the connection electrode 180 contacting the second substrate electrode 134 may include an opaque material. The connection electrode 180 may be coupled to the second substrate electrode 134 via a bonding portion S.

The insulating portion 140 may be disposed to cover the light emitting diode chip 120 and an upper surface of the substrate 110. The insulating portion 140 serves to protect the light emitting structure 29 of the light emitting diode chip 120 and the connection electrode 180 from external environments. Accordingly, the insulating portion 140 may be disposed to cover upper and side surfaces of the light emitting diode chip 120 while covering the entirety of the connection electrode 180 such that the connection electrode 180 cannot be exposed outside by the insulating portion 140. As in the tenth exemplary embodiment, the insulating portion 140 may include at least one of polydimethylsiloxane (PDMS), polyimide, poly(methyl methacrylate) (PMMA), and a ceramic material.

In this exemplary embodiment, the insulating portion 140 may contain at least one type of phosphor. Here, the insulating portion 140 may act as the phosphor portion 160 of the twelfth exemplary embodiment. In the structure wherein the insulating portion 140 contains at least one type of phosphor, the light emitting diode part 100a according to this exemplary embodiment may further include the color filter 170 as described in the twelfth exemplary embodiment.

In this exemplary embodiment, the light emitting diode chip 120 may have a width L3 of 50 μm or less, or 10 μm or less. The light emitting diode part 100a may have a width L4 of 150 μm or more (preferably greater than 200 μm).

Figure 17:
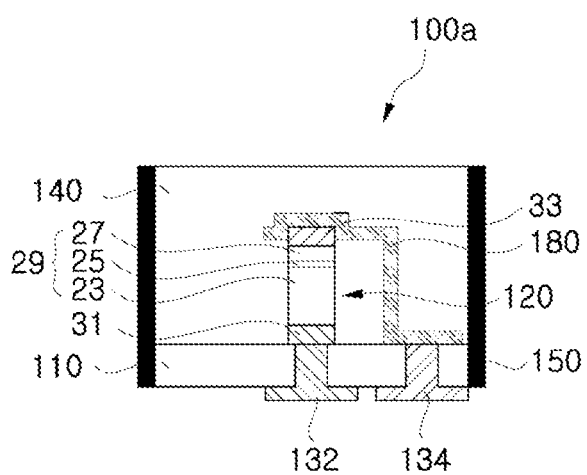
FIG. 17 is a sectional view of a light emitting diode package according to a fifteenth exemplary embodiment of the present invention

FIG. 17 is a sectional view of a light emitting diode package according to a fifteenth exemplary embodiment of the present invention.

Referring to FIG. 17, a light emitting diode part 100a according to the fifteenth exemplary embodiment includes a substrate 110, a light emitting diode chip 120, a first substrate electrode 132, a second substrate electrode 134, an insulating portion 140, a reflective portion 150, and a connection electrode 180.

In this exemplary embodiment, the substrate 110, the first substrate electrode 132, the second substrate electrode 134, the insulating portion 140, and the connection electrode 180 are the same as those of the light emitting diode package according to the fourteenth exemplary embodiment, and descriptions thereof will be omitted herein.

The reflective portion 150 is disposed to surround side surfaces of the substrate 110 and the insulating portion 140. The reflective portion 150 serves to reflect light traveling in the lateral direction of the light emitting diode package when the light emitted from the light emitting diode chip 120 is discharged through the insulating portion 140. Thus, as in the eleventh exemplary embodiment, the reflective portion 150 may include an opaque material having high reflectivity while providing less light loss. In addition, the reflective portion 150 may be coated with a high reflectivity (HR) material, as needed.

Although some exemplary embodiments have been described herein, it should be understood by those skilled in the art that these embodiments are given by way of illustration only, and that various modifications, variations, and alterations can be made without departing from the spirit and scope of the present invention. Therefore, the scope of the present invention should be limited only by the accompanying claims and equivalents thereof.

What is claimed is:
1. A display module comprising:
 a substrate including a first electrode and a second electrode; and
 a light source disposed on the substrate,
 wherein the light source includes a plurality of light cells,
 wherein each of the plurality of light cells comprises a light emitting layer and a coupling layer covering the light emitting layer,
 wherein the coupling layer covers at least a region of a surface of the light emitting layer,
 wherein the light emitting layer of at least one of the plurality of light cells comprises:
  a first conductivity type semiconductor layer;
  a second conductivity type semiconductor layer;
  an active layer interposed between the first and second conductivity type semiconductor layers; and
  a third electrode electrically connected to the first conductivity type semiconductor layer,
 wherein at least one of the plurality of light cells further comprises a fourth electrode electrically connected to the second conductivity type semiconductor layer, the third and fourth electrodes being arranged in one direction of the light emitting layer,
 wherein the third electrode is electrically connected to an exposed region of the first conductivity type semiconductor layer formed by partially removing the active layer and the second conductivity type semiconductor layer,
 wherein at least one of the plurality of light cells further comprises:
  an encapsulation layer covering at least a region of the third and fourth electrodes and the light emitting layer while insulating the third and fourth electrodes from each other;

a first bump electrically connected to the third electrode; and a second bump electrically connected to the fourth electrode, wherein the first and second bumps are electrically connected to the third and fourth electrodes through the encapsulation layer, respectively, and wherein the first and second bumps laterally extend across a lower surface of the encapsulation layer.

2. The display module of claim 1, wherein the coupling layer comprises at least one of polydimethylsiloxane (PDMS), polyimide, poly(methyl methacrylate) (PMMA), a ceramic material, an epoxy resin, and a synthetic resin.

3. The display module of claim 1, wherein at least one of the first and second electrode is disposed on upper and lower surfaces of the substrate and through a hole formed in the substrate.

4. The display module of claim 1, further comprising a reflective layer to cover a region of the coupling layer.

5. The display module of claim 4, wherein the reflective layer reflects light emitted through the coupling layer.

6. The display module of claim 1, wherein the coupling layer is formed of an opaque material or a translucent material.

7. The display module of claim 1, further comprising a wavelength conversion layer disposed to cover the plurality of light cells and an upper surface of the substrate.

8. The display module of claim 7, further comprising a color filter disposed on the wavelength conversion layer and configured to block light in a predetermined range of wavelengths of light emitted through the wavelength conversion layer.

9. The display module of claim 8, wherein the color filter has a region having a smaller thickness than that of the wavelength conversion layer.

10. A display apparatus, comprising:
a substrate including a first electrode and a second electrode;
a light source disposed on the substrate; and
a wavelength conversion layer disposed on the light source and an upper surface of the substrate,
wherein the light source includes a plurality of light cells,
wherein each of the plurality of light cells comprises a light emitting layer and a coupling layer covering the light emitting layer,
wherein the coupling layer covers at least a region of a surface of the light emitting layer,
wherein the light emitting layer of at least one of the plurality of light cells comprises:
a first conductivity type semiconductor layer;
a second conductivity type semiconductor layer;
an active layer interposed between the first and second conductivity type semiconductor layers; and
a third electrode electrically connected to the first conductivity type semiconductor layer,
wherein at least one of the plurality of light cells further comprises a fourth electrode electrically connected to the second conductivity type semiconductor layer,
wherein the third electrode is electrically connected to an exposed region of the first conductivity type semiconductor layer formed by partially removing the active layer and the second conductivity type semiconductor layer,
wherein at least one of the plurality of light cells further comprises:
an encapsulation layer covering at least a region of the third and fourth electrodes and the light emitting layer while insulating the third and fourth electrodes from each other;
a first bump electrically connected to the third electrode; and
a second bump electrically connected to the fourth electrode,
wherein the first and second bumps are electrically connected to the third and fourth electrodes through the encapsulation layer, respectively, and
wherein the first and second bumps laterally extend across a lower surface of the encapsulation layer.

11. The display apparatus of claim 10, further comprising a reflective layer to cover a region of the coupling layer.

12. The display apparatus of claim 11, wherein the reflective layer reflects light emitted through the coupling layer.

13. The display apparatus of claim 10, wherein the coupling layer is formed of an opaque material or a translucent material.

14. The display apparatus of claim 10, further comprising a color filter disposed on the wavelength conversion layer and configured to block light in a predetermined range of wavelength of light emitted through the wavelength conversion layer.

15. The display apparatus of claim 14, wherein the color filter has a region having a smaller thickness than that of the wavelength conversion layer.

16. A display apparatus, comprising:
a substrate including a first electrode and a second electrode; and
a light source disposed on the substrate,
wherein the light source includes a plurality of light cells,
wherein each of the plurality of light cells comprises a light emitting layer and a coupling layer covering the light emitting layer,
wherein the coupling layer covers at least a region of a surface of the light emitting layer,
wherein the light emitting layer of at least one of the plurality of light cells comprises:
a first conductivity type semiconductor layer;
a second conductivity type semiconductor layer;
an active layer interposed between the first and second conductivity type semiconductor layers; and
a third electrode electrically connected to the first conductivity type semiconductor layer,
wherein at least one of the plurality of light cells further comprises a fourth electrode electrically connected to the second conductivity type semiconductor layer,
wherein the third electrode is electrically connected to an exposed region of the first conductivity type semiconductor layer formed by partially removing the active layer and the second conductivity type semiconductor layer,
wherein at least one of the plurality of light cells further comprises:
an encapsulation layer covering at least a region of the third and fourth electrodes and the light emitting layer while insulating the third and fourth electrodes from each other;
a first bump electrically connected to the third electrode; and
a second bump electrically connected to the fourth electrode,
wherein the first and second bumps are electrically connected to the third and fourth electrodes through the encapsulation layer, respectively, and wherein the first and second bumps extend across a lower surface of the encapsulation layer.

17. The display apparatus of claim 16, further comprising a reflective layer to cover a region of the coupling layer.

18. The display apparatus of claim 17, wherein the reflective layer reflects light emitted through the coupling layer.

19. The display apparatus of claim 16, further comprising a wavelength conversion layer disposed to cover the plurality of light cells and an upper surface of the substrate.

20. The display apparatus of claim 19, further comprising a color filter disposed on the wavelength conversion layer and configured to block light in a predetermined range of wavelengths of light emitted through the wavelength conversion layer.

* * * * *